US011522055B2

(12) United States Patent
Ohmagari et al.

(10) Patent No.: US 11,522,055 B2
(45) Date of Patent: Dec. 6, 2022

(54) STACK COMPRISING SINGLE-CRYSTAL DIAMOND SUBSTRATE

(71) Applicant: NATIONAL INSTITUTE OF ADVANCED INDUSTRIAL SCIENCE AND TECHNOLOGY, Tokyo (JP)

(72) Inventors: Shinya Ohmagari, Ikeda (JP); Hideaki Yamada, Ikeda (JP); Hitoshi Umezawa, Ikeda (JP); Nobuteru Tsubouchi, Ikeda (JP); Akiyoshi Chayahara, Ikeda (JP); Yoshiaki Mokuno, Ikeda (JP); Akinori Seki, Toyota (JP); Fumiaki Kawai, Toyota (JP); Hiroaki Saitoh, Toyota (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 160 days.

(21) Appl. No.: 16/962,203

(22) PCT Filed: Jan. 11, 2019

(86) PCT No.: PCT/JP2019/000772
§ 371 (c)(1),
(2) Date: Jul. 14, 2020

(87) PCT Pub. No.: WO2019/139147
PCT Pub. Date: Jul. 18, 2019

(65) Prior Publication Data
US 2021/0066078 A1 Mar. 4, 2021

(30) Foreign Application Priority Data

Jan. 15, 2018 (JP) .............................. JP2018-004027

(51) Int. Cl.
H01L 29/16 (2006.01)
C23C 16/01 (2006.01)
(Continued)

(52) U.S. Cl.
CPC .......... H01L 29/1602 (2013.01); C23C 16/01 (2013.01); C23C 16/279 (2013.01);
(Continued)

(58) Field of Classification Search
CPC .................................................. H01L 29/6603
See application file for complete search history.

(56) References Cited

U.S. PATENT DOCUMENTS 5,371,383 A * 12/1994 Miyata ................ H01L 29/1602
257/E29.255
5,384,470 A * 1/1995 Tachibana ............... H01L 29/47
257/280

(Continued)

FOREIGN PATENT DOCUMENTS

JP H07-048198 A 2/1995
JP 2003-068592 A 3/2003
(Continued)

OTHER PUBLICATIONS

May et al., "785 nm Raman Spectroscopy of CVD Diamond Films", 2008, Mater. Res. Soc. Symp. Proc. vol. 1039, 9 pages. (Year: 2008).*

(Continued)

Primary Examiner — Scott B Geyer
(74) Attorney, Agent, or Firm — Knobbe, Martens, Olson & Bear, LLP

(57) ABSTRACT

A stack including at least a semiconductor drift layer stacked on a single-crystal diamond substrate having a coalescence boundary, wherein the coalescence boundary of the single-crystal diamond substrate is a region that exhibits, in a
(Continued)

Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, the coalescence boundary has a width of 200 μm or more, and the semiconductor drift layer is stacked on at least the coalescence boundary.

6 Claims, 10 Drawing Sheets

(51) Int. Cl.
    *C23C 16/27*     (2006.01)
    *C30B 25/20*     (2006.01)
    *C30B 29/04*     (2006.01)
    *H01L 21/02*     (2006.01)
    *H01L 29/66*     (2006.01)
    *H01L 29/872*     (2006.01)

(52) U.S. Cl.
CPC ............. *C30B 25/20* (2013.01); *C30B 29/04* (2013.01); *H01L 21/0262* (2013.01); *H01L 21/02376* (2013.01); *H01L 21/02527* (2013.01); *H01L 21/02579* (2013.01); *H01L 29/6603* (2013.01); *H01L 29/872* (2013.01)

(56) References Cited

U.S. PATENT DOCUMENTS

| | | | | |
|---|---|---|---|---|
| 5,474,021 | A | | 12/1995 | Tsuno et al. |
| 7,646,025 | B1 | * | 1/2010 | Sung ................ H01L 33/34 257/77 |
| 11,251,461 | B2 | * | 2/2022 | Ohta ................ H01M 4/1397 |
| 2006/0060864 | A1 | * | 3/2006 | Gerbi ................ H01L 21/02658 438/105 |
| 2007/0017437 | A1 | | 1/2007 | Genis et al. |
| 2007/0232074 | A1 | * | 10/2007 | Ravi ................ C23C 16/27 438/758 |
| 2009/0173950 | A1 | * | 7/2009 | West ................ H01L 21/30625 257/77 |
| 2012/0193644 | A1 | * | 8/2012 | Linares ................ H01L 21/041 257/77 |
| 2012/0302045 | A1 | | 11/2012 | Yamada et al. |
| 2015/0206749 | A1 | * | 7/2015 | Khan ................ H01L 21/76871 438/105 |
| 2016/0071936 | A1 | | 3/2016 | Eon et al. |
| 2017/0170260 | A1 | * | 6/2017 | Dresselhaus ...... H01L 21/02422 |
| 2018/0068853 | A1 | * | 3/2018 | Khan ................ H01L 29/6603 |

FOREIGN PATENT DOCUMENTS

| | | | |
|---|---|---|---|
| JP | 2009-502705 | A | 1/2009 |
| JP | 5621994 | B | 10/2014 |
| JP | 2015-067516 | A | 4/2015 |
| JP | 2016-119428 | A | 6/2016 |
| JP | 2016-552988 | A | 8/2016 |
| WO | WO 2011-074599 | A1 | 6/2011 |

OTHER PUBLICATIONS

Anna Dychalska et al., "Study of CVD diamond layers with amorphous carbon admixture by Raman scattering spectroscopy", Materials Science—Poland, 33(4), 2015, pp. 799-805 (Year: 2015).*
R. Kumaresan et al., "Device processing, fabrication and analysis of diamond pseudo-vertical Schottky barrier diodes with low leak current and high blocking voltage", Diamond & Related Materials 18 (2009) 299-302 (Year: 2009).*
G. Janssen et al., "'Mosaic' growth of diamond", Diamond and Related Materials 4 (1995) 1025-1031 (Year: 1995).*
Dan Zhao et al., "Analysis of diamond pseudo-vertical Schottky barrier diode through patterning tungsten growth method", Appl. Phys. Lett. 112, 092102 (2018); 4 pages (Year: 2018).*
Hitoshi Umezawa et al., "Defect and field-enhancement characterization through electron-beam-induced current analysis", Appl. Phys. Lett. 110, 182103 (2017); 4 pages (Year: 2017).*
Extended European Search Report in European Patent Application No. 19738664.2, dated Aug. 20, 2021.
Washiyama, Shun, et al., "Coalescence of Epitaxial Lateral Overgrowth-Diamond on Stripe-Patterned Nucleation on Ir/MgO(001)", Applied Physics Express, vol. 4, No. 9 (2011) in 3 pages.
English Translation of ISR of PCT/JP2019/000772, mailed Apr. 9, 2019.
Mokuno, Y, et al., "Improving purity and size of single-crystal diamond plates produced by high-rate CVD growth and lift-off process using ion implantation," Diamond and Related Materials 18: 1258-1261 (2009).
Maeda, S., et al., "Fabrication of free-standing epitaxial diamond plate of 1 inch diameter," The 19th Diamond Symposium, Summary, 50 (2005).
Yamada, Hideaki et al., "Fabrication and fundamental characterizations of tiled clones of single-crystal diamond with 1-inch size," Diamond & Related Materials, Sep. 29, 2011, vol. 24: pp. 29-33.
Shu, Guoyang et al., "Epitaxial growth of mosaic diamond: Mapping of stress and defects in crystal junction with a confocal Raman spectroscopy," Journal of Crystal Growth, 2017, vol. 463: 19-26.

\* cited by examiner (a) Raman shift (b) Full width at half maximum

Evaluation of the crystallinity on the mosaic boundary (central region)

Murphy's plot

Measurement of electrode-size dependence in areas outside the boundary 9 types in total
Φ 30u, 60u, 120u, 180u, 220u, 260u, 300u, 340u, 400u Devices having a multi-barrier component in FW were counted as defective products $$Yield = \left\{\frac{1-\exp(-D \cdot S)}{D \cdot S}\right\}^2$$

$D$ : Critical killer defect density ($cm^{-2}$)
$S$ : Device size ($cm^2$)

STACK COMPRISING SINGLE-CRYSTAL DIAMOND SUBSTRATE

TECHNICAL FIELD

The present invention relates to a stack comprising a single-crystal diamond substrate. More specifically, the present invention relates to a stack comprising at least a semiconductor drift layer stacked on a single-crystal diamond substrate, a method for producing the stack, a method for producing a diamond semiconductor device using the stack, and a power semiconductor device obtained using the stack.

BACKGROUND ART

Diamond, which exhibits outstanding characteristics as a semiconductor, is a promising material for use in semiconductor devices, such as high-output power devices, high-frequency devices, and photoreceptor devices. In particular, in order to realize the practical use of diamond as a semiconductor material, wafers of single-crystal diamond having a large area and uniform quality are required.

Typical methods conventionally used for growing single-crystal diamond include a high-pressure synthesis method and a vapor-phase synthesis method. Of these methods, the high-pressure synthesis method can produce substrates with an area of only up to about 1×1 cm, and cannot be expected to produce single-crystal substrates with a larger area. Furthermore, single-crystal diamond substrates with an area of about 10×10 mm or more are not readily available, nor is it easy to increase the area of these substrates. Moreover, about 13×13 mm is the largest size ever reported for a single-crystal diamond produced by the vapor-phase synthesis method (see Non Patent Literature 1 below), and the maximum size of single-crystal diamond substrates generally available is up to about 8×8 mm.

In the vapor-phase synthesis method, a single-crystal diamond having a size of 1 inch has been realized by a heteroepitaxial growth method wherein a diamond is grown on a different kind of substrate (see Non Patent Literature 2 below). However, the diamond grown by this method is markedly inferior in crystallinity compared to a diamond grown on a single-crystal substrate.

For this reason, a method for producing a so-called mosaic diamond has been developed to produce a single-crystal diamond with a large area. In this method, diamond crystals are grown by a vapor-phase synthesis method on a plurality of high-temperature high-pressure synthetic diamond single crystals arranged on an identical surface, and the diamond crystals are connected to produce a large diamond crystal (see Patent Literature 1 below).

However, the above-described method requires many high-temperature high-pressure synthetic substrates to produce one large mosaic diamond substrate. Moreover, to reuse the substrate, it is necessary to remove the grown layer from the substrate by means of laser cutting or the like. In this case, particularly when separating a large substrate with a size above 10 mm by laser cutting, a considerably long time is required for the cutting, the amount of loss becomes large, and the diamond crystal may be destroyed.

In order to solve these problems, a method has been proposed in which a mosaic diamond substrate is produced in the same manner as described above, ions are subsequently implanted into the substrate, and then a diamond is grown and the diamond growth layer is separated from the mosaic diamond substrate to produce a mosaic diamond (see Patent Literature 2 below). With this method, the mosaic diamond can be reproduced by repeating the ion implantation and the growth of a diamond on the mosaic diamond substrate. In this method, however, after diamonds are grown on a plurality of diamonds used as seed crystals and connected to produce a mosaic diamond, it is necessary, before ion implantation, to form a flat and smooth surface by polishing a surface of the grown diamond. However, because precise diamond processing is extremely difficult, a great deal of working time is required as the area of the connected substrates increases, and additionally, the diamond crystal may be destroyed during polishing.

As a method for solving these problems, Patent Literature 3, for example, discloses a method for producing a mosaic diamond comprising implanting ions into a plurality of single-crystal diamond substrates to form non-diamond layers in the vicinity of surfaces of the single-crystal diamond substrates, wherein the single-crystal diamond substrates are arranged in a mosaic pattern on a flat support before or after ion implantation; growing a single-crystal diamond layer, by a vapor-phase synthesis method, on the ion-implanted surfaces of the single-crystal diamond substrates arranged in the mosaic pattern, to connect the single-crystal diamond substrates; and etching the non-diamond layers to separate the single-crystal diamond layer in a portion above the non-diamond layers. This method can efficiently produce a large quantity of mosaic diamond with a high yield, by preventing destruction of single-crystal diamond substrates, using a simpler method than conventional methods.

CITATION LIST

Patent Literature

Patent Literature 1: JP H7-48198 A
Patent Literature 2: JP 2009-502705 A
Patent Literature 3: Japanese Patent No. 5621994

Non Patent Literature

Non Patent Literature 1: Y. Mokuno, A. Chayahara, H. Yamada, and N. Tsubouchi, Diamond and Related Materials 18, 1258 (2009).
Non Patent Literature 2: Maeda, Watanabe, Ando, Suzuki, Sawabe, The 19th Diamond Symposium, Summary, 50 (2005).

SUMMARY OF INVENTION

Technical Problem

As described above, the method disclosed in Patent Literature 3, for example, can efficiently produce a large quantity of mosaic diamond with a high yield, by preventing destruction of single-crystal diamond substrates, using a simpler method than conventional methods.

However, in a mosaic diamond, a coalescence boundary is formed in a position corresponding to a boundary between a plurality of single-crystal diamond substrates. The coalescence boundary of the mosaic diamond contains many defects due to discontinuity in crystal orientation. Thus, it is believed that there remain severe constraints on the use of mosaic diamonds for semiconductor devices and power semiconductor devices.

One method of using a mosaic diamond in a semiconductor device may be, for example, using the coalescence boundary of the mosaic diamond as a dicing line, rather than using it as a device. However, using the coalescence boundary as a dicing line has the disadvantage of losing the merit of the large-area mosaic diamond, and imposing an additional process constraint.

Under such circumstances, a main object of the present invention is to provide a novel stack that includes a single-crystal diamond substrate having a coalescence boundary, yet effectively uses the coalescence boundary. Other objects of the present invention are to provide a power semiconductor device obtained using the stack, a method for producing the stack, a method for producing a diamond semiconductor device, and a method for producing a single-crystal diamond substrate for use in producing a diamond semiconductor device.

Solution to Problem

The present inventors have conducted extensive research to solve the problems described above. As a result, they have found that in a stack comprising at least a semiconductor drift layer stacked on a single-crystal diamond substrate having a coalescence boundary, wherein the coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, the coalescence boundary has a width of 200 μm or more, and the semiconductor drift layer is stacked on at least the coalescence boundary, the single-crystal diamond substrate having a coalescence boundary is used, yet the semiconductor drift layer is formed on the coalescence boundary, and the coalescence boundary can be effectively used. The present invention has been completed as a result of further research based on this finding.

In summary, the present invention provides embodiments of the invention as itemized below:

Item 1. A stack comprising at least a semiconductor drift layer stacked on a single-crystal diamond substrate having a coalescence boundary, wherein the coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, the coalescence boundary has a width of 200 μm or more, and the semiconductor drift layer is stacked on at least the coalescence boundary.

Item 2. The stack according to item 1, wherein a P+ conductive layer and the semiconductor drift layer are stacked in this order on the coalescence boundary.

Item 3. The stack according to item 2, wherein an electrode is further stacked on the semiconductor drift layer.

Item 4. A power semiconductor device comprising the stack according to any one of items 1 to 3.

Item 5. A method for producing a stack comprising the steps of:

preparing a single-crystal diamond substrate having a coalescence boundary; and stacking a semiconductor drift layer on at least the coalescence boundary of the single-crystal diamond substrate, wherein the coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, and the coalescence boundary has a width of 200 μm or more.

Item 6. A method for producing a stack comprising the steps of:

preparing a stack A comprising a P+ conductive layer stacked on at least a coalescence boundary of a single-crystal diamond substrate having the coalescence boundary; and further stacking a semiconductor drift layer on the P+ conductive layer, wherein the coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, and the coalescence boundary has a width of 200 μm or more.

Item 7. A method for producing a stack comprising the steps of:

preparing a stack B comprising a P+ conductive layer and a semiconductor drift layer stacked in this order on a coalescence boundary of a single-crystal diamond substrate having the coalescence boundary; and further stacking an electrode on the semiconductor drift layer, wherein the coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, and the coalescence boundary has a width of 200 μm or more.

Item 8. A method for producing a diamond semiconductor device comprising the steps of:

preparing a stack C comprising a P+ conductive layer, a semiconductor drift layer, and an electrode stacked in this order on at least a coalescence boundary of a single-crystal diamond substrate having the coalescence boundary; and cutting the stack C in a stacked direction, wherein the coalescence boundary of the single-crystal diamond substrate is a region that exhibits, in a Raman spectrum at a laser excitation wavelength of 785 nm, a full width at half maximum of a peak near 1.332 cm$^{-1}$ due to diamond that is observed to be broader than a full width at half maximum of the peak exhibited by a region different from the coalescence boundary, and the coalescence boundary has a width of 200 μm or more.

Item 9. A method for producing a single-crystal diamond substrate for use in producing a diamond semiconductor device, comprising the steps of:

preparing a single-crystal diamond substrate having a coalescence boundary; and polishing a surface of the single-crystal diamond substrate, wherein the coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, and the coalescence boundary has a width of 200 µm or more.

Advantageous Effects of Invention

The present invention can provide a novel stack that includes a single-crystal diamond substrate having a coalescence boundary, yet effectively uses the coalescence boundary. The present invention can also provide a power semiconductor device obtained using the stack, a method for producing the stack, a method for producing a diamond semiconductor device, and a method for producing a single-crystal diamond substrate for use in producing a diamond semiconductor device.

DESCRIPTION OF EMBODIMENTS

1. Stack

Figure 1:
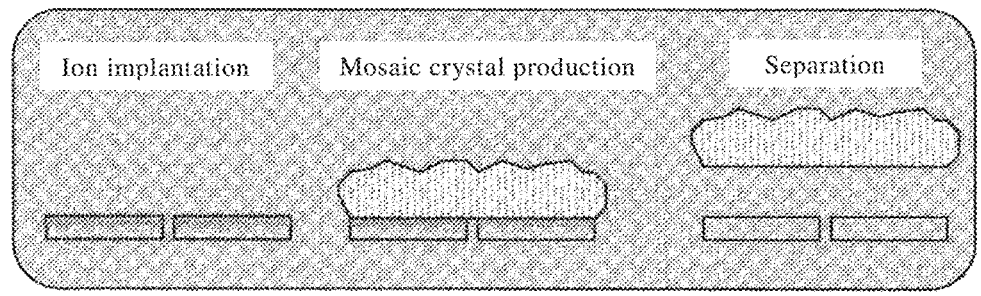
FIG. 1 is a schematic diagram showing the steps of one exemplary method (first method) for producing a single-crystal diamond substrate having a coalescence boundary.

A stack of the present invention comprises at least a semiconductor drift layer stacked on a single-crystal diamond substrate having a coalescence boundary, wherein the coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, the coalescence boundary has a width of 200 µm or more, and the semiconductor drift layer is stacked on at least the coalescence boundary. The stack of the present invention has the specific coalescence boundary on the single-crystal diamond substrate. The semiconductor drift layer is formed on the coalescence boundary, and the coalescence boundary can be effectively used.

As described above, the method for producing a mosaic diamond as disclosed in Patent Literature 3, for example, can efficiently produce a large quantity of mosaic diamond with a high yield, by preventing destruction of single-crystal diamond substrates. However, in the mosaic diamond produced, a coalescence boundary is formed in a position corresponding to the boundary between a plurality of single-crystal diamond substrates. The coalescence boundary of the mosaic diamond contains many defects due to discontinuity in crystal orientation. Thus, it is believed that this imposes severe constraints on the use of mosaic diamonds for semiconductor devices.

As a result of research conducted by the present inventors to solve this problem, they have found that the above-described single-crystal diamond substrate having the predetermined coalescence boundary can be produced by using a technique for producing a mosaic diamond without forming a gap in a coalescence boundary (hereinafter sometimes referred to as the "technique for producing a single-crystal diamond substrate having a coalescence boundary"), as in the method for producing a mosaic diamond (single-crystal diamond substrate) adopted in, for example, Patent Literature 3, or the article in "Yamada et al., Diamond Relat. Mater. 24 (2012) 29", Japanese Patent No. 4849691, WO 2011/074599 A1, JP 2015-67516 A, or JP 2015-67517 A, and when a semiconductor drift layer is provided on the coalescence boundary of the single-crystal diamond substrate, the resulting stack can be suitably used as a diamond semiconductor device, a power semiconductor device, or the like. The stack of the present invention will be hereinafter described in detail.

In the stack of the present invention, at least a semiconductor drift layer is stacked on a single-crystal diamond substrate. The single-crystal diamond substrate has a coalescence boundary. One example of the single-crystal diamond substrate having a coalescence boundary will be described in detail in the section "Method for Producing Single-Crystal Diamond Substrate Having Coalescence boundary" below.

As used herein, the coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary. Specifically, when a mosaic diamond (single-crystal diamond substrate) is produced by connecting a plurality of single-crystal diamond substrates, by using the above-described "technique for producing a single-crystal diamond substrate having a coalescence boundary", a coalescence boundary is formed in the connected region between the plurality of single-crystal diamond substrates. The crystallinity of the coalescence boundary is inferior to that of a region different from the coalescence boundary (for example, a central region of the single-crystal diamond substrate). Therefore, in a Raman spectrum at a laser excitation wavelength of 785 nm, the full width at half maximum of the peak near 1.332 cm$^{-1}$ due to diamond exhibited by the coalescence boundary is observed to be broader than the full width at half maximum of the peak exhibited by the region different from the coalescence boundary. In the present invention, the single-crystal diamond substrate includes a coalescence boundary having a width (i.e., a maximum length in a direction perpendicular to a thickness direction of the single-crystal diamond substrate) of 200 μm or more.

While the stack of the present invention includes the coalescence boundary having a width of 200 μm or more, the width of the coalescence boundary may be 300 μm or more, for example. However, the width of the coalescence boundary is preferably 1000 μm or less, and more preferably 800 μm or less. In the stack of the present invention, it is only required that the below-described semiconductor drift layer be stacked on the coalescence boundary having a width of 200 μm or more (i.e., the coalescence boundary having a width of 200 μm or more is at least partially present on the single-crystal diamond substrate, and the semiconductor drift layer is stacked on the coalescence boundary); in the stack of the present invention, it is not required that the width of the entire coalescence boundary be 200 μm or more, and a coalescence boundary having a width of less than 200 μm may be included. In the present invention, the below-described semiconductor drift layer may be stacked on the coalescence boundary having a width of less than 200 μm, or may be stacked on a region outside the coalescence boundary. Preferably, in the stack of the present invention, the semiconductor drift layer is stacked on all of a main surface formed by one surface of the single-crystal diamond substrate. The width of the coalescence boundary can be measured by Raman mapping (see the Examples).

The coalescence boundary is typically formed by connecting a plurality of plate-like single-crystal diamond substrates, for example. A coalescence boundary formed by connecting three or four plate-like single-crystal diamond substrates has a width greater than that formed by two plate-like single-crystal diamond substrates.

Examples of the semiconductor drift layer include, but are not limited to, known semiconductor drift layers provided in known semiconductor devices (particularly diamond semiconductor devices), for example, a diamond semiconductor drift layer. Specific examples of the semiconductor drift layer include a boron-doped diamond semiconductor drift layer (p (drift layer)).

While the boron concentration in the boron-doped diamond semiconductor drift layer is not limited, the lower limit is, for example, $1 \times 10^{15}$ cm$^{-3}$ or more, preferably $1 \times 10^{16}$ cm$^{-3}$ or more, and the upper limit is, for example, $1 \times 10^{19}$ cm$^{-3}$ or less, preferably $1 \times 10^{18}$ cm$^{-3}$ or less.

While the thickness of the semiconductor drift layer is not limited, it is, for example, about 1 to 100 μm, and preferably about 5 to 20 μm. The semiconductor drift layer may be formed of a single layer or a plurality of layers. When the semiconductor drift layer is formed of a plurality of layers, the layers may be composed of different materials.

While the method for forming the semiconductor drift layer is not limited, a known method for forming a semiconductor drift layer, such as chemical vapor deposition (CND), can be adopted.

In the stack of the present invention, a P+ conductive layer, for example, can be provided between the coalescence boundary of the single-crystal diamond substrate and the semiconductor drift layer. In this case, in the stack of the present invention, the P+ conductive layer and the semiconductor drift layer are stacked in this order on the coalescence boundary. When the stack of the present invention has the P+ conductive layer, typically, the P+ conductive layer is also stacked between the region different from the coalescence boundary and the semiconductor drift layer.

Examples of the P+ conductive layer include known P+ conductive layers provided in known semiconductor devices (particularly diamond semiconductor devices), for example, a diamond P+ conductive layer. Specific examples of the P+ conductive layer include a boron-doped diamond P+ conductive layer.

While the boron concentration in the boron-doped diamond P+ conductive layer is not limited, the lower limit is, for example, $1 \times 10^{19}$ cm$^{-3}$ or more, preferably $1 \times 10^{20}$ cm$^{-3}$ or more, and the upper limit is, for example, $1 \times 10^{22}$ cm$^{-3}$ or less, preferably $1 \times 10^{21}$ cm$^{-3}$ or less.

Regarding the specific resistance of the P+ conductive layer, the upper limit is, for example, 10 mΩcm or less, preferably 5 mΩcm or less, and the lower limit is, for example, 1 mΩcm.

While the thickness of the P+ conductive layer is not limited, it is, for example, about 1 to 100 μm, and preferably about 3 to 20 μm. The P+ conductive layer may be formed of a single layer or a plurality of layers. When the P+ conductive layer is formed of a plurality of layers, the layers may be composed of different materials.

In the stack of the present invention, an electrode may be further stacked on the semiconductor drift layer. When the electrode is provided, a region of the stack including the electrode can be suitably used as a diamond semiconductor device. When the electrode is stacked in the stack of the present invention, the electrode may be stacked not only on the coalescence boundary having a width of 200 μm or more, but also on the coalescence boundary having a width of less than 200 μm or on the region outside the coalescence boundary. The electrode is formed in a pattern adapted to the structure, application, and the like of a diamond semiconductor device or a power device.

The electrode is typically composed of a metal. The type of the metal, the electrode size, thickness, structure, and the like are appropriately selected according to the structure, application, and the like of the diamond semiconductor device or the power device for which the stack of the present invention is to be used.

Examples of the metal constituting the electrode include molybdenum, gold, titanium, and tungsten. An alloy containing at least one of these metals may also be used.

While the thickness of the electrode is not limited, it is, for example, about 0.001 to 1 µm, and preferably about 0.01 to 0.05 µm. The electrode may be formed of a single layer or a plurality of layers. When the electrode is formed of a plurality of layers, the layers may be composed of different materials.

(Method for Producing Single-Crystal Diamond Substrate Having Coalescence Boundary)

In the present invention, the above-described single-crystal diamond substrate having the predetermined coalescence boundary can be produced by using the "technique for producing a single-crystal diamond substrate having a coalescence boundary", as described above. Hereinafter, the method disclosed in Patent Literature 3 will be described as one example of the technique. The below-described method is one exemplary method for producing a single-crystal diamond substrate having a coalescence boundary; in the present invention, it is only required that the single-crystal diamond substrate having the predetermined coalescence boundary be provided. It is noted, however, that the single-crystal diamond substrate does not have a gap (i.e., a region where single-crystal diamond is not present) in the coalescence boundary.

The single-crystal diamond substrate having the predetermined coalescence boundary can be produced by using the "technique for producing a single-crystal diamond substrate having a coalescence boundary"; however, in order to use the single-crystal diamond substrate obtained by this method in the production of a diamond semiconductor device, it is preferred to polish a surface of the single-crystal diamond substrate having the predetermined coalescence boundary after the single-crystal diamond substrate is prepared. The conventional "technique for producing a single-crystal diamond substrate having a coalescence boundary" does not contemplate polishing a surface of the single-crystal diamond substrate, because it does not contemplate using the single-crystal diamond substrate as a diamond semiconductor device by stacking a semiconductor drift layer and the like on the coalescence boundary. In the present invention, however, in order to use the single-crystal diamond substrate as a diamond semiconductor device by stacking a semiconductor drift layer and the like on the coalescence boundary, it is preferred to polish a surface of the single-crystal diamond substrate.

The method disclosed in Patent Literature 3 is a method for producing a mosaic diamond comprising implanting ions into a plurality of single-crystal diamond substrates to form non-diamond layers in the vicinity of surfaces of the single-crystal diamond substrates, wherein the single-crystal diamond substrates are arranged in a mosaic pattern on a flat support before or after ion implantation; growing a single-crystal diamond layer, by a vapor-phase synthesis method, on the ion-implanted surfaces of the single-crystal diamond substrates arranged in the mosaic pattern, to connect the single-crystal diamond substrates; and etching the non-diamond layers to separate the single-crystal diamond layer in a portion above the non-diamond layers. More specifically, examples of this method include the following first, second, and third methods.

(1) First Method

FIG. 1 is a conceptual diagram showing one exemplary method for producing a single-crystal diamond substrate having a coalescence boundary. In the method shown in FIG. 1, ions are first implanted into a plurality of single-crystal diamond substrates used as seed substrates to form non-diamond layers in the vicinity of surfaces of the single-crystal diamond substrates. The single-crystal diamond substrates used as seed substrates are arranged in a mosaic pattern on a flat support before or after ion implantation. A single-crystal diamond layer is grown by a vapor-phase synthesis method on the ion-implanted surfaces of the single-crystal diamond substrates thus arranged in the mosaic pattern to connect the single-crystal diamond substrates. Thereafter, the non-diamond layers are etched to separate the single-crystal diamond layer in a portion above the non-diamond layers, thereby producing a single-crystal diamond substrate having a coalescence boundary (mosaic diamond) (this method is hereinafter referred to as "the first method"). Each step of the first method will be hereinafter described in detail.

(i) Ion Implantation Step

In the first method, ions are first implanted into a plurality of single-crystal diamond substrates used as seed substrates to form ion-implanted layers having a deteriorated crystal structure in the vicinity of surfaces of the substrates.

The ion implantation method is a method in which a sample is irradiated with swift ions. Typically, ion implantation is performed as follows: A desired element is ionized and extracted. The resulting ions are accelerated in an electric field created by, applying a voltage, after which the ions are mass-separated, and ions with a desired level of energy are directed to the sample. Alternatively, ion implantation may be performed by a plasma-ion implantation method, in which the sample is immersed in a plasma, and negative high-voltage pulses are applied to the sample to attract positive ions in the plasma to the sample. Examples of implanted ions include carbon, oxygen, argon, helium, and protons.

The ion implantation energy may be in the range of about 10 keV to 10 MeV, which is typically used in ion implantation. The implanted ions are distributed mainly, at an implantation depth (projectile range) with a certain span, that is determined according to the type and energy of the ions, as well as the type of the material into which the ions are implanted. Damage to the sample is greatest in the vicinity of the projectile range where the ions stop, but the surface side of the sample above the vicinity of the projectile range also experiences a certain degree of damage caused by the passage of the ions. The projectile range and the degree of damage can be calculated and predicted using a Monte Carlo simulation code, such as the SRIM code, which can be downloaded from, for example, The Stopping and Range of ions in Matter, James F. Ziegler, Jochen P. Biersack, Matthias D. Ziegler, http://www.srim.org/index.htm# HOMETOP.

When ions are implanted into the single-crystal diamond substrate, and the dose exceeds a certain level, the crystal structure at the surface side of the substrate above the vicinity of the ion projectile range deteriorates, which causes destruction of the diamond structure and formation of a non-diamond layer.

The depth and thickness of the resulting non-diamond layer vary depending on the type of ions used, the ion implantation energy, the dose, the type of material into which the ions are implanted, and the like. Therefore, these conditions may be determined so that a separable non-diamond layer is formed in the vicinity of the ion projectile range. Usually, the maximum atomic density of the implanted ions is preferably about $1\times10^{20}$ atoms/cm$^3$ or more. To ensure the formation of a non-diamond layer, the maximum atomic density is preferably about $1\times10^{21}$ atoms/cm$^3$.

For example, when carbon ions are implanted at an implantation energy of 3 MeV, the ion dose may be from about $1\times10^{16}$ to $1\times10^{17}$ ions/cm$^2$. In this case, if the ion dose is too high, the crystallinity of the surface deteriorates, whereas if the dose is too low, a non-diamond layer is not sufficiently formed, which makes it difficult to separate the surface layer portion.

By implanting ions using the above-described method, a non-diamond layer is formed in the vicinity of the surfaces of the seed substrates.

While the depth at which the non-diamond layer is formed is not limited, the greater the depth, the thicker the mosaic diamond that can be subsequently separated.

After the ion implantation, a heat treatment is conducted on the parent substrate at a temperature of 600° C. or higher in a non-oxidizing atmosphere, such as in vacuum, a reducing atmosphere, or an oxygen-free inert gas atmosphere, thereby allowing graphitization of the non-diamond layer to proceed. In this manner, separation of the mosaic diamond by the below-described etching proceeds rapidly. The upper limit of the heat-treatment temperature is the temperature at which the diamond begins to graphitize, which is typically about 1200° C. The heat-treatment time varies depending on the treatment conditions, such as the heat-treatment temperature; for example, it may be about 5 minutes to 10 hours.

The manner in which the single-crystal diamond substrates used as seed substrates are arranged during ion implantation is not limited; the single-crystal diamond substrates may be arranged in any layout that allows ions to be uniformly implanted. However, before growing a single-crystal diamond in the below-described step of growing a single-crystal diamond, it is required that the single-crystal diamond substrates used as seed substrates be arranged in a mosaic pattern on a flat support. Thus, it is required that the single-crystal diamond substrates be arranged in a mosaic pattern on a flat support, before or after ion implantation.

The manner in which the single-crystal diamond substrates are arranged in a mosaic pattern is not limited; usually, they may be arranged so that side faces of the substrates are in contact with each other, or the distance between the side faces becomes as small as possible, so as to achieve an intended mosaic pattern on a flat support. In this case, when a plurality of single-crystal diamond substrates separated from an identical single-crystal diamond substrate are used as seed substrates, a mosaic diamond that is uniform in off-angle, crystal face direction, strain or defect distribution, and the like can be obtained by arranging the single-crystal diamond substrates to have the same crystal face direction.

When substrates are arranged in a mosaic pattern, abnormal diamond growth is likely to occur in regions where the vertexes of the substrates are close. Thus, when three or more substrates are arranged, it is preferred to avoid the vertexes of the three or more substrates from contacting each other or coming close to each other. Specifically, when two substrates are arranged so that their vertexes are in contact with or close to each other, it is preferred that the substrates be arranged so that the vertexes of other substrates are shifted from the regions where the vertexes of the two substrates are in contact with or close to each other.

Preferably, the single-crystal diamond substrates are arranged so that the side faces, where the substrates contact each other when arranged to form a mosaic pattern, forms an angle of 90° or less with the surfaces of the substrates, and the corner (edge) formed between the side faces and the surfaces of the substrates forms an angle of about 90° or less or forms a curved surface having a radius of curvature as small as possible. This can narrow the distance W between the edges of adjacently disposed substrate surfaces. Thus, when a single-crystal diamond layer is formed thereon by a vapor-phase synthesis method, the region having inferior crystallinity in the grown diamond layer can be narrowed.

Figure 2:
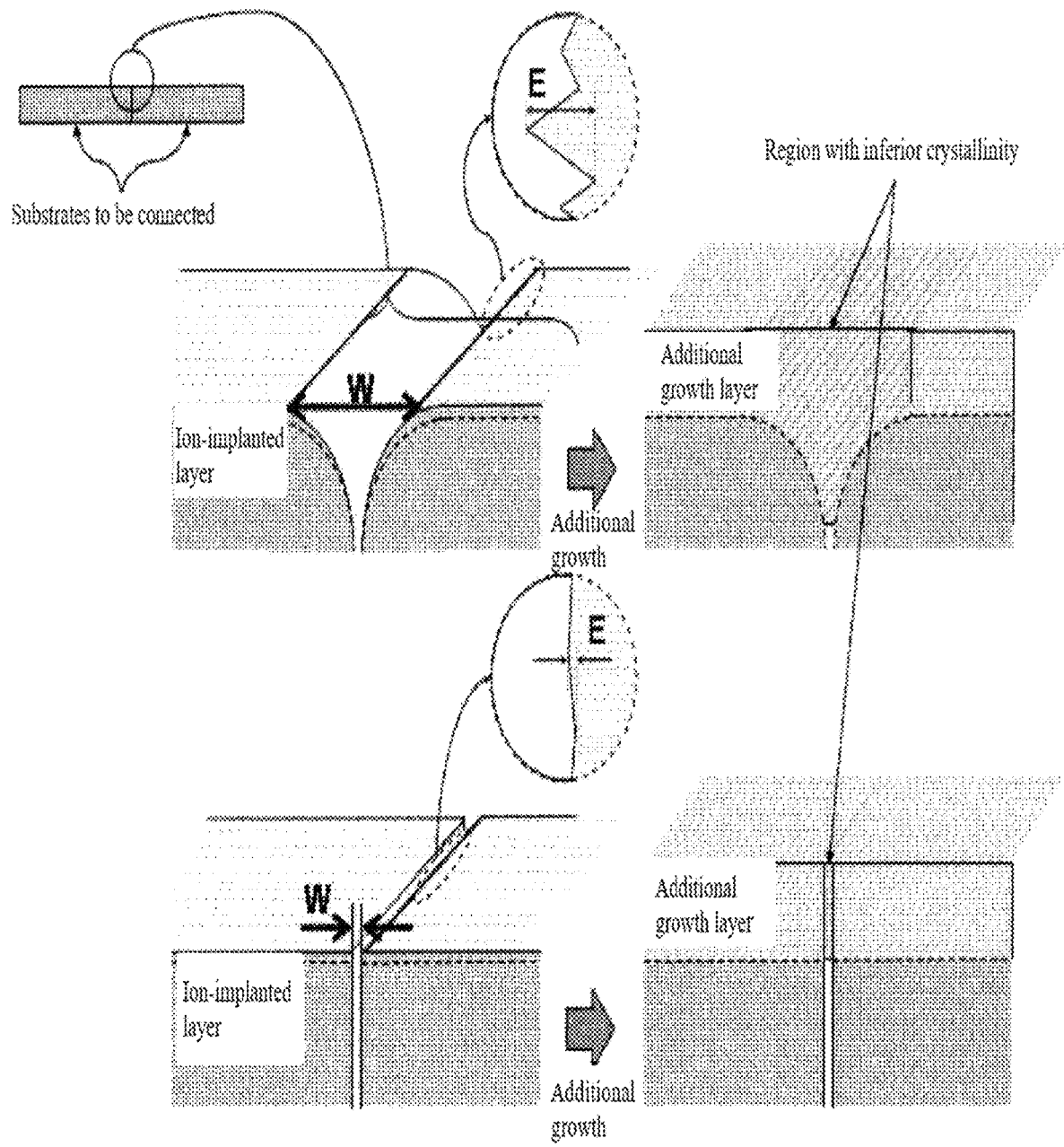
FIG. 2 is a schematic diagram showing side faces and edge shapes of single-crystal diamond substrates, and the state of a grown diamond layer.

FIG. 2 schematically shows this state. In FIG. 2, the upper left figure is an enlarged view of the edges when two substrates each having an edge with a large radius of curvature are arranged, and the lower left figure is an enlarged view of the edges when two substrates each having an edge with an angle of about 90° are arranged.

In this case, it is preferred that the edge along the ridge line formed by the side face and the substrate surface be processed as precisely as possible to make the edge almost a straight line. For example, as shown in FIG. 2, when the distance between the edges of two adjacent substrates is defined as W, the maximum width F of the shift from the straight line of the edge is such that the value E/W is preferably about 1/10 or less, and more preferably about $10^{-6}$ or less.

In FIG. 2, the lower left figure shows the state where the edge of a substrate has a small shift from the straight line, and the distance W between the edges of the two adjacent substrates is narrow. As is clear from a comparison between the upper right figure and the lower right figure of FIG. 2, when a single-crystal diamond layer is grown by a vapor-phase synthesis method on the arranged substrates each having an edge with an angle of about 90° and a small shift from the straight line, the region in which a diamond layer having inferior crystallinity is formed can be made very narrow. This makes it possible to widen the area in which a single-crystal diamond layer with high quality is formed.

The method for processing the side faces of the single-crystal diamond substrates to satisfy the above-described conditions is not limited, and known methods can be adopted, for example, scaife polishing, mechanochemical polishing, laser processing, ultraviolet irradiation, plasma etching, ion beam etching, and neutral beam irradiation. The higher the processing accuracy, the more preferable. Examples of applicable methods include polishing using fine metal particles, hydrogen peroxide and the like as an abrasive; laser processing using laser light having a short pulse width and a short wavelength; ultraviolet irradiation using a stepper and the like; plasma etching using a lithographic technique; ion beam etching; and neutral beam irradiation.

The shapes of the side faces and edges of the single-crystal diamond substrates described above are also applicable to the single-crystal diamond substrates used in the second and third methods described below.

The type of support is not limited as long as it has a flat region on which all of the single-crystal diamond substrates used as seed substrates can be arranged. When the support used in ion implantation is also used in the below-described step of growing a single-crystal diamond by a vapor-phase synthesis method, it is preferred to use a support formed of a metal or an alloy with a high-melting point and a good thermal conductivity suitable for the vapor-phase synthesis method, such as molybdenum or tungsten.

(ii) Step of Growing Single-Crystal Diamond

Subsequently, a single-crystal diamond is grown by a vapor-phase synthesis method on surfaces of the seed substrates on which the non-diamond layers are formed and arranged in a mosaic pattern by the method described above.

The vapor-phase synthesis method is not limited, and known methods, such as a microwave plasma CVD method, a hot filament method, and a DC discharge method, are applicable.

In particular, using a microwave plasma CVD method, a single-crystal diamond film with a high purity can be grown. Specific production conditions are not limited; a single-crystal diamond may be grown according to known conditions. For example, a gas mixture of methane and hydrogen can be used as a source gas. Specifically, the conditions for growing diamond may, for example, be as follows: When a gas mixture of hydrogen and methane is used as a reaction gas, methane is preferably supplied in a proportion of about 0.01 to 0.33 mol per mol of hydrogen supplied. The pressure inside the plasma CVD apparatus may be typically about 13.3 to 40 kPa. Microwaves typically used are those having a frequency of 2.45 GHz, 915 MHz, or like frequencies that are industrially or scientifically permitted. The microwave power is not limited, and is typically about 0.5 to 5 kW. Within these ranges, the conditions may be adjusted so that the temperature of the substrate (single-crystal diamond substrate) becomes about 900 to 1300° C., and preferably about 900 to 1100° C.

The thickness of the grown single-crystal diamond is not limited, and may be determined according to the thickness of the intended mosaic diamond. For example, the thickness may be about 100 to 1000 μm.

(iii) Step of Etching Non-Diamond Layers

After the single-crystal diamond layer is grown by the method described above, a surface portion above the non-diamond layers is separated by etching the non-diamond layers formed in step (i). In this manner, the single-crystal diamond in the surface portion is separated, and the intended mosaic diamond can be obtained. This method eliminates the need for the troublesome step of cutting and polishing the grown diamond layer, simplifies the working process, and avoids destruction of the diamond crystal caused by polishing.

In contrast, for example, in the method disclosed in Patent Literature 2 above, after diamonds are grown on a plurality of diamonds used as seed crystals to produce a mosaic diamond, it is necessary, before ion implantation, to form a flat and smooth surface by polishing a surface of the grown diamond. In this case, the connected mosaic diamond is likely to break during the polishing step, and additionally, there is the serious problem that the polishing step requires a very long time to polish the mosaic diamond connected and having a large area.

However, in the method as disclosed in Patent Literature 3, the troublesome step of cutting and polishing the grown diamond layer is unnecessary. This greatly reduces the processing time, and improves the yield and thus, can dramatically improve the production efficiency.

The method for separating the surface portion from the non-diamond layers is not limited; for example, methods such as electrochemical etching, thermal oxidation, and electrical discharge machining are applicable.

An exemplary method for removing the non-diamond layers by electrochemical etching is, for example, as follows: Two electrodes are disposed at a certain distance in an electrolytic solution. The single-crystal diamond substrate on which the non-diamond layers are formed is placed between the electrodes in the electrolytic solution, and a DC voltage is applied across the electrodes. The electrolytic solution is preferably pure water. While the electrode material may be any conductive material, it is preferably a chemically stable electrode, such as platinum, graphite, or the like. The electrode distance and the applied voltage may be adjusted to allow etching to proceed most rapidly. The electric field strength in the electrolytic solution is typically from about 100 to 300 V/cm.

Moreover, when etching is conducted by applying an AC voltage in the method for removing the non-diamond layers by electrochemical etching, even if many single-crystal diamond substrates are arranged in a mosaic pattern, etching proceeds extremely rapidly into the crystal in the non-diamond layers, allowing the diamond at the surface side above the non-diamond layers to be separated in a short period of time.

In the method wherein an AC voltage is applied as well, the electrode distance and the applied voltage may be adjusted so that etching proceeds most rapidly. Typically, the electric field strength in the electrolytic solution, which is determined by dividing the applied voltage by the electrode distance, is preferably about 50 to 10000 V/cm, and more preferably about 500 to 10000 V/cm.

While a commercial sinusoidal alternating current with a frequency of 60 or 50 Hz is readily available as an alternating current, the waveform is not limited to a sinusoidal wave, as long as the current has a similar frequency component.

Advantageously, the pure water used as the electrolytic solution has high specific resistance (i.e., low conductivity), which allows the application of a higher voltage. Ultrapure water produced using a general apparatus for producing ultrapure water has sufficiently high specific resistance, i.e., about 18 MΩ·cm, and is thus suitable for use as the electrolytic solution.

An exemplary method for removing the non-diamond layers by thermal oxidation is, for example, as follows: The substrate is heated to a high temperature of about 500 to 900° C. in an oxygen atmosphere, thereby etching the non-diamond layers by oxidation. In this case, as etching proceeds farther into the diamond, the passage of oxygen from the outer periphery of the crystal becomes difficult. For this reason, if oxygen ions are selected as the ions for forming the non-diamond layers and implanted at a dose sufficiently greater than the dose necessary for etching to occur, oxygen can also be supplied from the inside of the non-diamond layers during etching, allowing the non-diamond layers to be etched more rapidly.

Because the graphitized non-diamond layers are electrically conductive, they can also be cut (etched) by electrical discharge machining.

By etching the non-diamond layers to separate the single-crystal diamond layer in the surface portion by the method described above, the intended single-crystal diamond substrate having a coalescence boundary (mosaic diamond) can be obtained.

After separating the mosaic diamond by the method described above, by further subjecting the plurality of single-crystal diamond substrates arranged in the mosaic pattern repeatedly to the ion implantation step, the step of growing a single-crystal diamond by a vapor-phase synthesis method, and the step of etching the non-diamond layers, a plurality of single-crystal diamond substrates having a coalescence boundary (mosaic diamond) can be easily produced.

(2) Second Method

Figure 3:
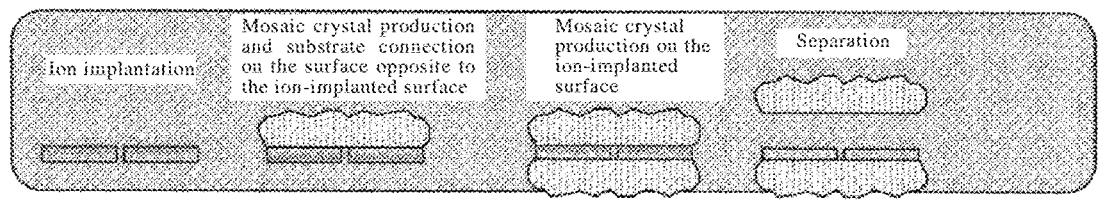
FIG. 3 is a schematic diagram showing the steps of one exemplary method (second method) for producing a single-crystal diamond substrate having a coalescence boundary.

FIG. 3 is a conceptual diagram showing the second method. The method shown in FIG. 3 includes the following steps (i) to (v) (this method is hereinafter referred to as "the second method"):

(i) implanting ions into a plurality of single-crystal diamond substrates used as seed substrates to form non-diamond layers in the vicinity of surfaces of the single-crystal diamond substrates;

(ii) inverting each of the single-crystal diamond substrates having the non-diamond layers formed thereon, and arranging the single-crystal diamond substrates in a mosaic pattern on a flat support;

(iii) growing a single-crystal diamond layer by a vapor-phase synthesis method on the single-crystal diamond substrates arranged in the mosaic pattern in step (ii) to connect the single-crystal diamond substrates;

(iv) inverting the connected single-crystal diamond substrates on the flat support again to make the ion-implanted surfaces face upward, and growing a single-crystal diamond layer on the ion-implanted surfaces by a vapor-phase synthesis method; and (v) after growing the single-crystal diamond layer, etching the non-diamond layers to separate the single-crystal diamond layer formed in a portion above the non-diamond layers.

In the second method, in step (i), ions are implanted into the single-crystal diamond substrates used as seed substrates to form non-diamond layers. Here, the manner in which the single-crystal diamond substrates are arranged is not limited; the single-crystal diamond substrates may be arranged in any layout that allows ions to be uniformly implanted. The conditions for the ion implantation may be the same as those employed in the first method.

Subsequently in step (ii) of the second method, each of the single-crystal diamond substrates having the non-diamond layers formed thereon by ion implantation in step (i) is inverted and arranged in an intended mosaic pattern on a flat support. Here, the ion-implanted surfaces of the single-crystal diamond substrates are placed in contact with the support.

Subsequently in step (iii), a single-crystal diamond layer is grown by a vapor-phase synthesis method on surfaces opposite to the ion-implanted surfaces of the single-crystal diamond substrates arranged in the mosaic pattern, thereby connecting the plurality of single-crystal diamond substrates. This connecting step makes it possible to obtain a mosaic substrate having substantially the same height for the ion-implanted surfaces, without having to strictly equalize the thicknesses of the seed substrates.

The method for growing the single-crystal diamond layer is not limited and, for example, the same conditions as in the step of growing a single-crystal diamond of the first method may be employed. The thickness of the formed single-crystal diamond layer is not limited as long as it can impart sufficient connection strength to each single-crystal diamond substrate, and, for example, may be about 100 to 1000 μm. Furthermore, this connecting step thermally connects each of the single-crystal substrates. This equalizes the temperature distribution on the substrate in the subsequent step (iv); therefore, the effect of obtaining a uniform distribution of growth parameters, such as growth rate, can be expected.

Subsequently in step (iv), the single-crystal diamond substrates connected in step (iii) are inverted on the flat support again to make the ion-implanted surfaces face upward, and a single-crystal diamond layer is grown on the ion-implanted surfaces by a vapor-phase synthesis method. The conditions for growing the single-crystal diamond in this case may also be the same as those employed in the step of growing a single crystal diamond of the first method. The thickness of the formed single-crystal diamond layer may be determined according to the thickness of the intended mosaic diamond, and may be, for example, about 100 to 1000 μm.

Subsequently in step (v), the non-diamond layers are etched to separate a surface portion above the non-diamond layers. In this manner, the single-crystal diamond in the surface portion is separated, and the intended single-crystal diamond substrate having a coalescence boundary (mosaic diamond) can be obtained. This method also eliminates the need for the troublesome step of cutting and polishing the grown diamond layer, simplifies the working process, and avoids destruction of the diamond crystal caused by polishing.

After the mosaic diamond is separated by the method described above, if the single-crystal diamond substrates from which the mosaic diamond has been separated are repeatedly subjected to the step of forming non-diamond layers by ion implantation, the step of growing a single-crystal diamond by a vapor-phase synthesis method, and the step of etching the non-diamond layers, a plurality of single-crystal diamond substrates having a coalescence boundary (mosaic diamonds) can be easily produced.

(3) Third Method

The third method may, for example, include the following steps (i) to (vi) (this method is hereinafter referred to as "the third method"):

(i) arranging a plurality of single-crystal diamond substrates in a mosaic pattern on a flat support;

(ii) forming a single-crystal diamond layer, by a vapor-phase synthesis method, on surfaces of the single-crystal diamond substrates arranged in the mosaic pattern, to connect the single-crystal diamond substrates;

(iii) inverting the connected single-crystal diamond substrates on the flat support;

(iv) implanting ions into the inverted single-crystal diamond substrates to form non-diamond layers in the vicinity of the surfaces of the single-crystal diamond substrates:

(v) growing a single-crystal diamond layer by a vapor-phase synthesis method on the surface of each of the single-crystal diamond substrates having the non-diamond layers formed thereon; and (vi) after growing the single-crystal diamond layer, etching the non-diamond layers to separate the single-crystal diamond layer in a portion above the non-diamond layers.

In the third method, in step (i), a plurality of single-crystal diamond substrates used as seed substrates are arranged in a mosaic pattern on a flat support. The method of arranging the substrates is not limited, and the seed substrates may be arranged in the same manner as that in the first method.

Subsequently in step (ii), a single-crystal diamond layer is grown by a vapor-phase synthesis method on surfaces of the single-crystal diamond substrates arranged in the mosaic pattern, thereby connecting the single-crystal diamond substrates arranged in the mosaic pattern. In this step, a single-crystal diamond may be grown in the same manner as in step (iii) of the second method to provide sufficient connection strength for each of the single-crystal diamond substrates.

Subsequently in step (iii), the connected single-crystal diamond substrates are inverted on the flat support. This step places the single-crystal diamond layer grown in step (ii) in contact with the surface of the support.

Subsequently in step (iv), ions are implanted into the single-crystal diamond substrates inverted in step (iii) to form non-diamond layers in the vicinity of surfaces of the single-crystal diamond substrates. The conditions for the ion implantation in this step may, for example, be the same as those employed in the ion implantation step of the first method.

Subsequently in step (v), a single-crystal diamond layer is grown by a vapor-phase synthesis method on the surface of each of the single-crystal diamond substrates having the non-diamond layers formed thereon. Subsequently in step (vi), the non-diamond layers are etched to separate a surface portion above the non-diamond layers. In this manner, the single-crystal diamond in the surface portion is separated, and the intended single-crystal diamond substrate having a coalescence boundary (mosaic diamond) can be obtained. The conditions of steps (v) and (vi) may be the same as those in steps (iv) and (v) of the second method. This method also eliminates the need for the troublesome step of cutting and polishing the grown diamond layer, simplifies the working process, and avoids destruction of the diamond crystal caused by polishing.

After the mosaic diamond is separated by the method described above, if the single-crystal diamond substrates from which the mosaic diamond has been separated are repeatedly subjected to step (iv) of forming non-diamond layers by ion implantation, step (v) of growing a single-crystal diamond by a vapor-phase synthesis method, and step (vi) of etching the non-diamond layers, a plurality of mosaic diamonds can be easily produced.

Furthermore, in each of the first to third methods, if the above-described process including forming non-diamond layers by ion implantation, growing a single-crystal diamond by a vapor-phase synthesis method, and etching the non-diamond layers to separate the single-crystal diamond layer in a portion above the non-diamond layers is performed at, least once on the separated face of the mosaic diamond separated from the seed substrates arranged in the mosaic pattern, a mosaic diamond having the same shape as that of the mosaic diamond can be easily produced.

If, in step (iv) of growing a single-crystal diamond layer by a vapor-phase synthesis method of the second method, and in step (v) of growing a single-crystal diamond layer by a vapor-phase synthesis method of the third method, a single crystal diamond is grown under conditions such that it is grown only on the surface of each seed substrate without reaching the boundary between the seed substrates arranged in the mosaic pattern, these methods can be used as methods for mass-producing single-crystal diamond substrates.

In the present invention, the main surface formed by one surface of the single-crystal diamond substrate has a surface area of preferably 8 mm$^2$ or more, more preferably 12 mm$^2$ or more, and still more preferably 200 mm$^2$ or more. By producing the single-crystal diamond substrate using the above-described technique for producing a single-crystal diamond substrate having a coalescence boundary, the single-crystal diamond substrate having such a large area can be prepared. The upper limit of the surface area of the main surface formed by one surface of the single-crystal diamond substrate is, for example, 2500 mm$^2$ or less.

In the present invention, the thickness of the single-crystal diamond substrate is preferably 100 μm or more, and more preferably 200 μm or more. The upper limit of the thickness is, for example, 1000 μm or less.

2. Power Semiconductor Device

The stack of the present invention can be suitably used for a power semiconductor device (i.e., a semiconductor device for controlling or converting power, or supplying power). Specific examples of power semiconductor devices for which the stack of the present invention can be suitably used include diodes and transistors.

When the stack of the present invention is used for a power semiconductor device, a diamond semiconductor device including the stack of the present invention may be produced and used as the power semiconductor device. The diamond semiconductor device usually includes an electrode in addition to the single-crystal diamond substrate and the semiconductor drift layer.

By stacking the single-crystal diamond substrate having a coalescence boundary, the semiconductor drift layer, the electrode, and the like to provide the stack of the present invention having a desired device structure, and then dividing (dicing) the stack into semiconductor device units, individual diamond semiconductor devices can be produced.

3. Method for Producing Stack and Method for Producing Diamond Semiconductor Device The method for producing the stack of the present invention is not limited as long as it can produce a stack in which at least a semiconductor drift layer and optionally a P+ conductive layer, an electrode, and the like are stacked on the single-crystal diamond substrate having the predetermined coalescence boundary. Details of the single-crystal diamond substrate having the coalescence boundary, the semiconductor drift layer, the P+ conductive layer, and the electrode are as described above. The coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary. At least the semiconductor drift layer is stacked on the coalescence boundary having a width of 200 μm or more.

The stack of the present invention can be suitably produced by, for example, a method comprising the following steps:

preparing a single-crystal diamond substrate having a coalescence boundary; and stacking a semiconductor drift layer on at least the coalescence boundary of single-crystal diamond substrate.

Alternatively, the stack of the present invention can be suitably produced by, for example, a method comprising the following steps:

preparing a stack A comprising a P+ conductive layer stacked on at least a coalescence boundary of a single-crystal diamond substrate having the coalescence boundary; and further stacking a semiconductor drift layer on the P+ conductive layer.

Alternatively, the stack of the present invention can be suitably produced by, for example, a method comprising the following steps:

preparing a stack B comprising a P+ conductive layer and a semiconductor drift layer stacked in this order on a coalescence boundary of a single-crystal diamond substrate having the coalescence boundary; and further stacking an electrode on the semiconductor drift layer.

Furthermore, as set forth below, when the stack of the present invention comprises at least the single-crystal diamond substrate having the predetermined coalescence boundary, a semiconductor drift layer, a P+ conductive layer, and an electrode, a diamond semiconductor device can be produced by cutting the stack in a stacked direction.

The diamond semiconductor device of the present invention can be suitably produced by, for example, a method comprising the following steps:

preparing a stack C comprising a P+ conductive layer, a semiconductor drift layer, and an electrode stacked in this order on at least a coalescence boundary of a single-crystal diamond substrate having the coalescence boundary; and cutting the stack C in a stacked direction.

EXAMPLES

The present invention will be hereinafter described in detail with reference to examples; however, the present invention is not limited thereto.

(Production of Single-Crystal Diamond Substrate Having Coalescence Boundary)

Figure 4:
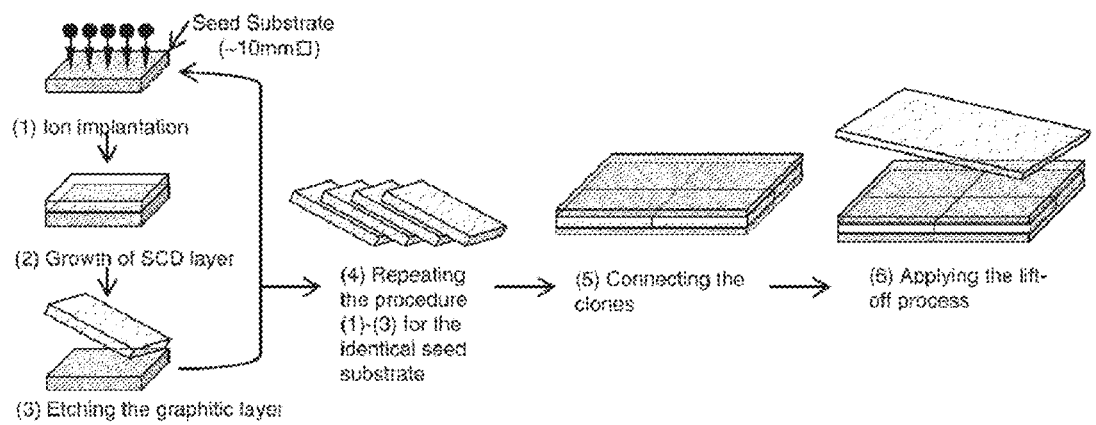
FIG. 4 is a process flow diagram of a single-crystal diamond substrate having a coalescence boundary (mosaic diamond) in the Examples.

A single-crystal diamond substrate having a coalescence boundary (mosaic diamond) was produced by the process flow shown in FIG. 4. Detailed conditions are as described in the article in "Yamada et al., Diamond Relat. Mater. 24 (2012) 29". The processes (1) to (4) shown in FIG. 4 reproduce seed substrates by means of ion implantation and a lift-off process using etching. The process (5) in FIG. 4 performs CVD epitaxial growth on parallel-arranged seed substrates. The process (6) in FIG. 4 performs substrate separation by the lift-off process. A mosaic crystal having crystal face (100), obtained by connecting four 10 mm seed substrates, was used herein as a sample. After the process (6) (separation of a connected substrate) in FIG. 4, the ion implantation, CVD growth, and lift-off processes were repeated several times using the separated face. As a result, the original seed crystal did not remain in the resulting free-standing substrate (single-crystal diamond substrate) after the separation. In the below-described evaluation of the crystallinity of the single-crystal diamond substrate, the separated face (graphitic layer-etching side) after the CVD growth was evaluated.

<Evaluation of Crystallinity of Coalescence Boundary of Single-Crystal Diamond Substrate>

The coalescence boundary of the single-crystal diamond substrate obtained above was evaluated by the Raman mapping method and the cathodoluminescence method.

(1) Evaluation by Raman Mapping Method

Figure 5:
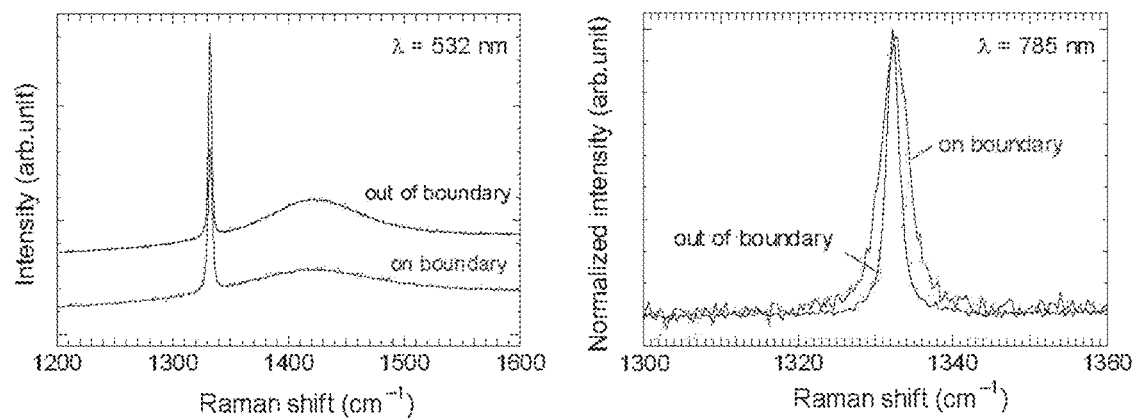
FIG. 5 is a graph showing Raman spectra (left: λ=532 nm; right: λ=785 nm) measured on the coalescence boundary and outside the coalescence boundary of a single-crystal diamond substrate (mosaic diamond) in the Examples.

Evaluation of the coalescence boundary of the single-crystal diamond substrate by the Raman mapping method was conducted under the following conditions:

Apparatus: RAMANtouch manufactured by Nanophoton Corporation
Laser wavelength: 532 nm/785 nm
Grating: 1200 gr/mm
Wavenumber resolution: about 2 cm$^{-1}$ (using 1200 gr/mm)
Objective lens: ×5 ($N_A$ 0.15)
CCD temperature: −75° C., air-cooling
Spatial resolution=0.61×λ/$N_A$=2.16 μm (when λ=532 nm, $N_A$=0.15)
Mapping distance: 10 μm XY FIG. 5 shows Raman spectra measured on the coalescence boundary and outside the coalescence boundary of the single-crystal diamond substrate (mosaic diamond) (Raman spectra on and outside the coalescence boundary of the mosaic single-crystal substrate). Laser excitation wavelengths of 532 nm and 785 nm were used. A sharp Raman profile due to diamond was observed near 1332 cm$^{-1}$. G-band and D-band due to non-diamond components were not observed. On the boundary, the full width at half maximum was broader, and a tendency of the peak position to shift slightly was observed. At a laser wavelength of 532 nm, fluorescence due to the nitrogen-vacancy center (NV$^0$ center) in diamond is observed near 1.420 cm$^{-1}$. This fluorescence intensity is correlated with the N concentration (H. Yamada, A. Chayahara, Y. Mokuno, Effects of intentionally introduced nitrogen and substrate temperature on growth of diamond bulk single crystals, Jpn. J. Appl. Phys. 55 (2016) 01AC07. http://stacks.iop.org/1347-4065/55/i=1S/a=01AC07), and it is presumed that the incorporation of N is low on the boundary. To eliminate the effect of the fluorescence due to the NV$^0$ center, Raman mapping measurement was conducted at λ=785 nm.

Figure 6:
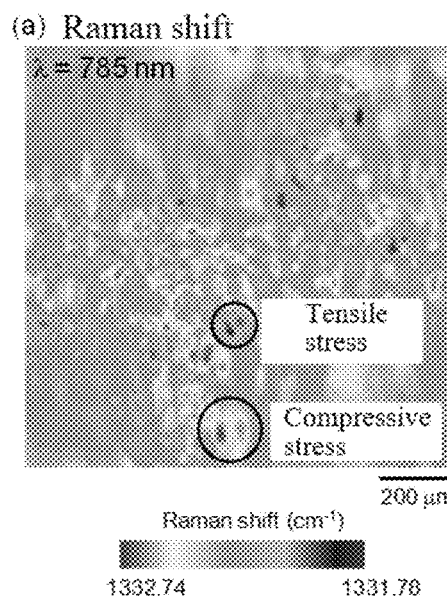
FIG. 6 is a diagram showing the results of 2D Raman mapping measurement conducted near a central region of the coalescence boundary of a single-crystal diamond substrate (mosaic diamond) in the Examples (FIG. 6(a) shows Raman shift mapping, and FIG. 6(b) shows FWHM mapping).
Figure 6:
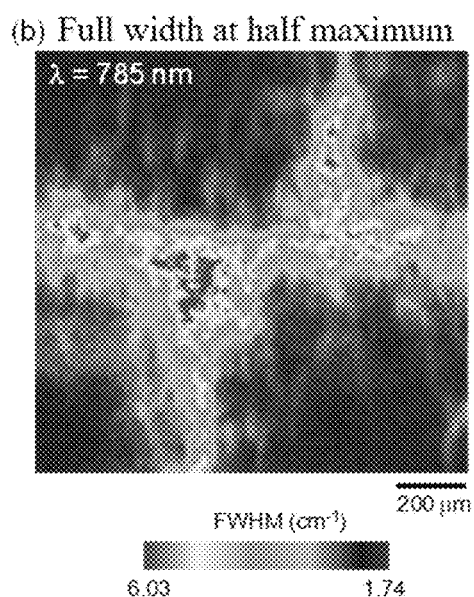
Figure 6:
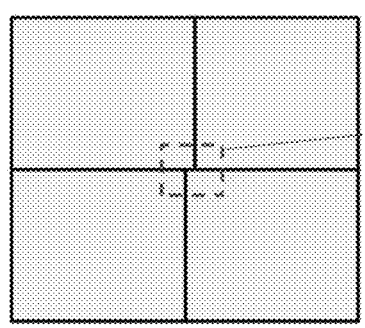

Subsequently, FIG. 6 shows the results of 2D Raman mapping measurement conducted near a central region of the coalescence boundary of the single-crystal diamond substrate (mosaic diamond) (two-dimensional 2D Raman mapping of the coalescence boundary (central region) of the mosaic crystal). FIG. 6(a) shows Raman shift mapping, and FIG. 6(b) shows FWHM mapping. Raman shift mapping images a shift from the central wavenumber to allow a stress distribution to be visualized. The Raman central wavenumber in a region sufficiently away from the coalescence boundary was 1332.26 cm$^{-1}$. It was found that a stress shift of at most about ±0.48 cm$^{-1}$ is observed locally near the coalescence boundary. This local stress was broadly and discontinuously distributed over about 400 μm near the coalescence boundary, rather than being concentrated on the coalescence boundary. Residual stress is calculated based on the diamond Raman peak position, using the following expression:

[Expression 1]

$$\sigma[GPa]=(v_0-v)/\alpha \tag{1}$$

where $v_0(v)$ is the shift amount from the central wavenumber $v_0$; and α is the conversion factor. A conversion factor of 3 cm$^{-1}$/GPa is used for diamond. A positive value represents tensile stress, and a negative value represents compressive stress. A shift amount of ±0.48 cm$^{-1}$ observed herein corresponds to a residual stress of 0.16 GPa. It is found that this value is lower than a stress of 1 to 2 GPa generally observed in polycrystal diamond, and is approximately equal to a residual stress of ~0.1 Mpa observed in crystal defect positions on single-crystal diamond substrates (Y. Kato, H. Umezawa, S. I. Shikata, Teraji, Local stress distribution of dislocations in homoepitaxial chemical vapor deposite single-crystal diamond, Diam. Relat. Mater. 23. (2012) 109-111. doi:10.1016/j.diamond.2012.01.024). It is therefore believed that a dislocation or a bundle of dislocations causes local stress. In the FWHM mapping shown in FIG. 6(b), broadening of the FWHM was clearly observed in the position of the coalescence boundary. The FWHM was broadened to at most about 6 cm$^{-1}$.

(2) Evaluation by Cathodoluminescence Method

Evaluation of the coalescence boundary of the single-crystal diamond substrate by the cathodoluminescence method was conducted under the following conditions:

JEOL 7001F manufactured by JEOL Ltd.
Electron beam acceleration voltage: 15 kV
Magnification: ×1500
Electron penetration depth: 1.74 μm (Kanaya, Okayama model)
Sample temperature: 80 K
Spectrometer: TRIAX190 manufactured by HORIBA
Grating: 300 gr/mm (blaze wavelength: 250 nm)
PMT slit width: 1.2 mm
Bandwidth during mapping: about 20 nm (central wavelength: 430 nm, 300 gr/mm)

Figure 7:
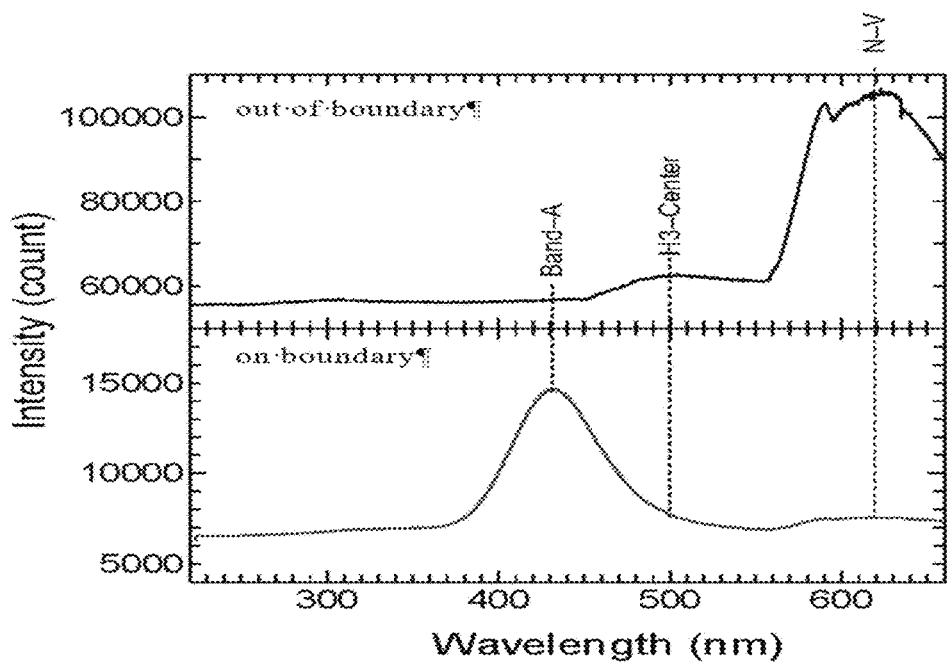
FIG. 7 is a cathodoluminescence spectrum (on or outside the coalescence boundary) of a single-crystal diamond substrate in the Examples.

FIG. 7 shows cathodoluminescence spectra measured near the coalescence boundary of the single-crystal diamond substrate (cathodoluminescence spectra measured outside the coalescence boundary and on the coalescence boundary). A Band-A emission (430 nm) due to defects was mainly observed on the coalescence boundary. Outside the boundary, the N-V emission and a strong emission due to the H3 center (N-V-N or V-N-N-V) were observed; Band-A overlapped with these emissions, and did not appear as a clear spectrum. Since the measurements were made in an identical sample face, assuming that the injected electron dose is constant, the N-associated CL intensity on the boundary is about 1/10. The N-V emission intensity is considered to depend on the N concentration, and there was only a small change in the incorporation of N on the boundary, as presumed from the Raman spectrum. It would also be possible that the Band-A defects on the boundary or the like acted as the recombination center of the N-V emission.

Figure 8:
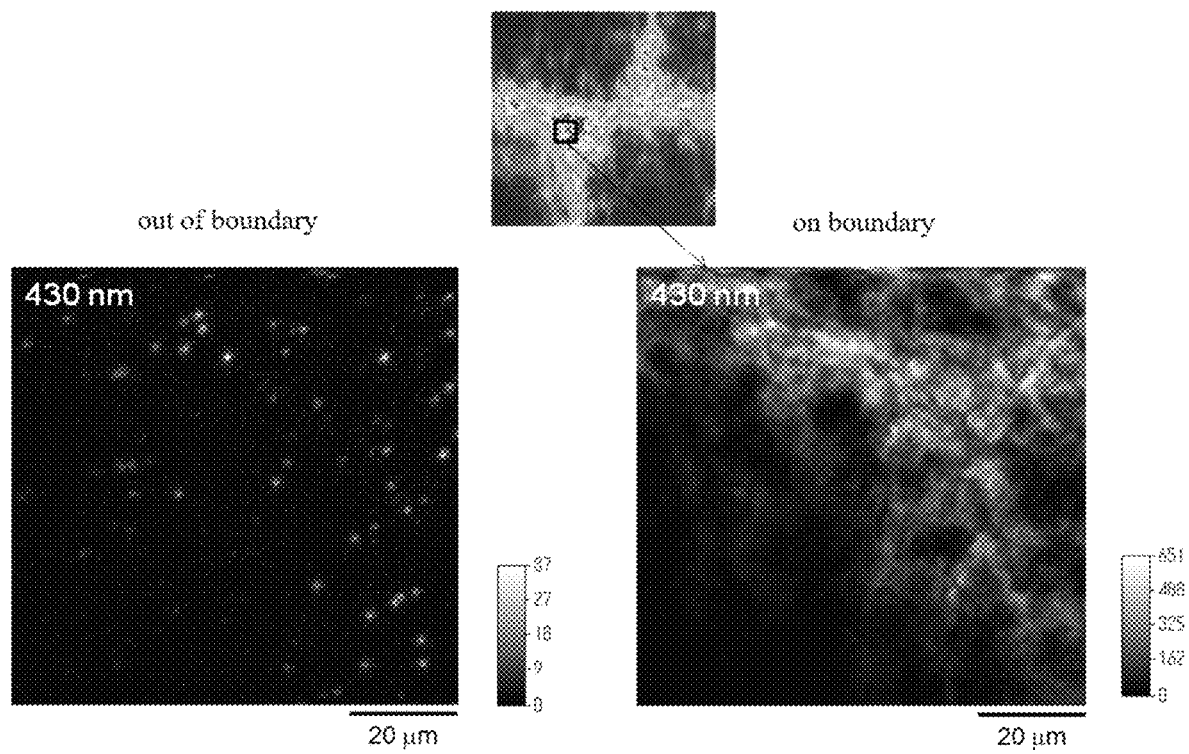
FIG. 8 is a cathodoluminescence spectral mapping image (on or outside the coalescence boundary) of the Band-A emission of a single-crystal diamond substrate in the Examples.

FIG. 8 shows cathodoluminescence spectral mapping images of the Band-A emission (cathodoluminescence spectral mapping measured outside the coalescence boundary and on the coalescence boundary; the images were taken using a band pass filter of 430 nm). With the band pass filter of 430 nm, intensity mapping was performed using a photomultiplier tube (PMT). Outside the boundary, the Band-A emission was observed as white dots, and the spot density was $1 \times 10^6$ cm$^{-2}$. This density was higher than the dislocation density (about $10^4$ cm$^{-2}$) in Ib substrates produced by a high-temperature high-pressure method, and lower than the dislocation density (about $10^8$ cm$^{-2}$) in heteroepitaxial substrates. On the boundary, a network-like pattern was observed as a whole, in addition to the dot-like pattern. It is presumed that crystal defects such as dislocations were present at a high density.

<Evaluation of Electrical Characteristics of Coalescence Boundary of Single-Crystal Diamond Substrate>

Figure 9:
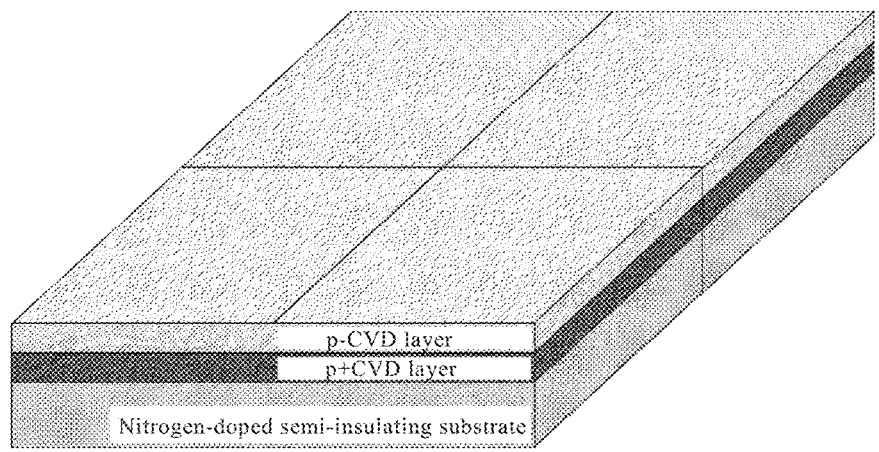
FIG. 9 is a schematic diagram of a stack in which a p+ conductive layer and a p− drift layer are stacked on a single-crystal diamond substrate (stacked diamond for a pseudovertical Schottky barrier diode (pVSBD)) in the Examples.
Figure 10:
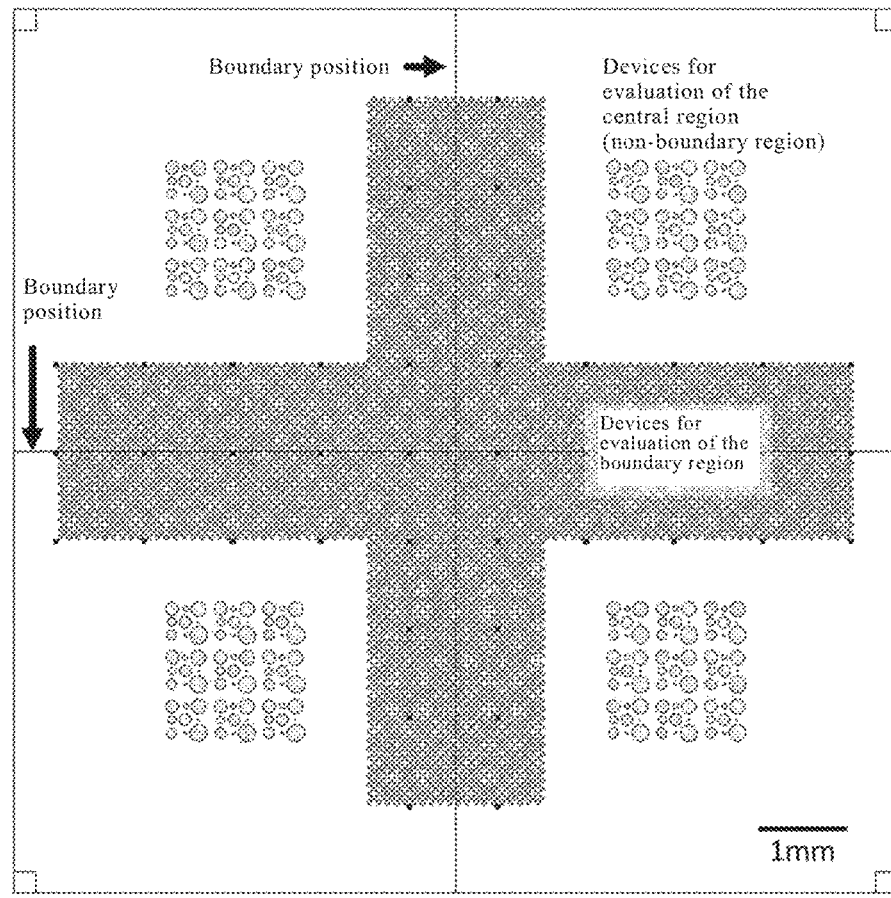
FIG. 10 is a device map of a stack in which a p+ conductive layer and a p− drift layer are stacked on a single-crystal diamond substrate (stacked diamond for a pseudovertical Schottky barrier diode (pVSBD)) in the Examples.
Figure 11:
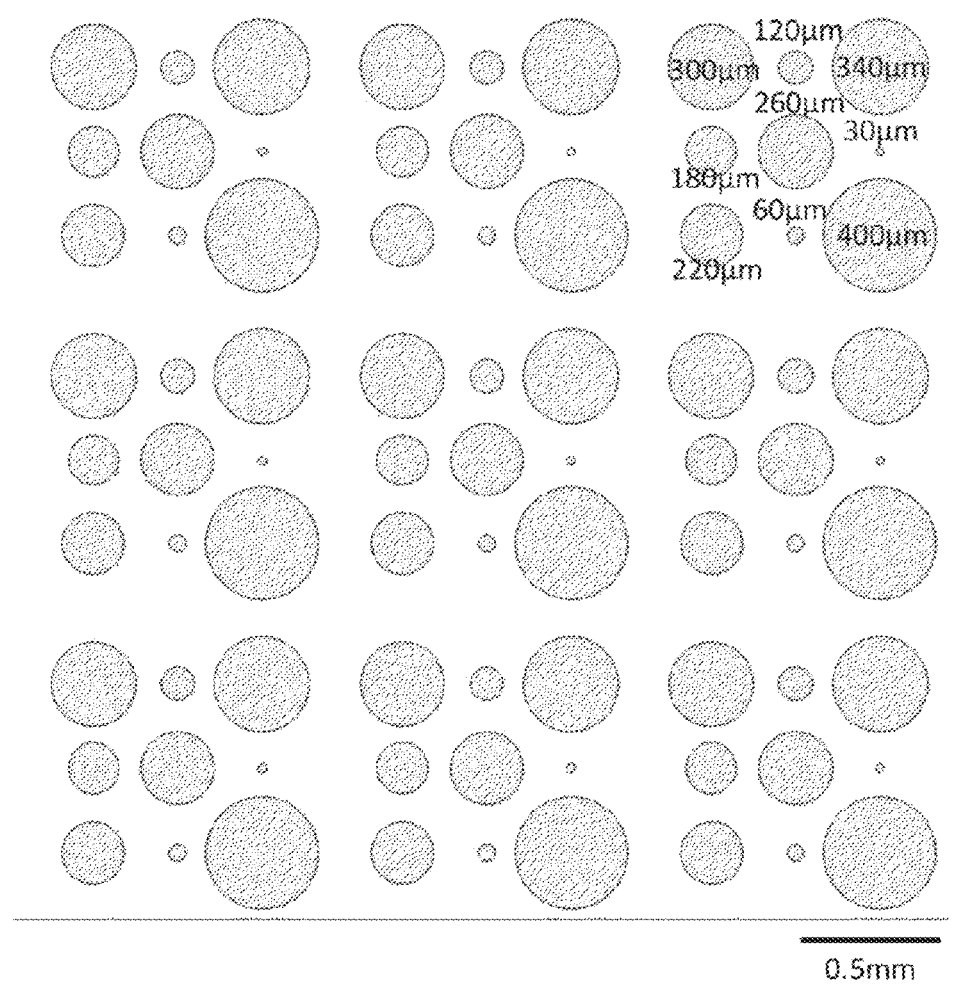
FIG. 11 is a device map (enlarged view of a device map of a central region of each mosaic region) of a stack in which a p+ conductive layer and a p− drift layer are stacked on a single-crystal diamond substrate (stacked diamond for a pseudovertical Schottky barrier diode (pVSBD)) in the Examples.

Electrical characteristics of the coalescence boundary of the single-crystal diamond substrate obtained above were evaluated. First, to make a prototype of a pseudovertical Schottky barrier diode, a p+ conductive layer and a p– drift layer were stacked on the single-crystal diamond substrate to obtain a stack (stacked diamond for a pseudovertical Schottky barrier diode (pVSBD)). The doping concentration in the p+ conductive layer was about $10^{20}$/cm$^3$, and the doping concentration in the p– drift layer was about $10^{18}$/cm$^3$ (see FIG. 9; the "nitrogen-doped semi-insulating substrate" in FIG. 9 corresponds to the single-crystal diamond substrate). A Schottky electrode was formed on the stack (p– drift layer side) by using lithography. The Schottky electrode was Mo/Au, and a device was formed by using a lift-off process. Subsequently, an ohmic electrode was formed by forming Ti/Mo/Au in a thickness of 10 nm/10 nm/30 nm with a metal through-mask. The conditions for each of the processes (CVD synthesis conditions and electrode formation conditions) were as follows:

CVD Synthesis Conditions
<p+ Conductive Layer>
Hot-filament CVD apparatus (manufactured by sp3 Diamond Technologies)
H$_2$ 1000 sccm, CH$_4$ 30 sccm, TMB (2%)/H$_2$ 5 sccm
Methane concentration: 3%, B/C 3300 ppm
Pressure: 10 Torr
Synthesis time: 10 h
Film thickness: about 5 μm
Boron concentration: about $10^{20}$ cm$^{-3}$ <p (Drift Layer>
Microwave plasma CVD apparatus (manufactured by Cones Technologies)
H$_2$ 480 sccm, CH$_4$ 20 sccm, O$_2$ 0.1 sccm
Methane concentration: 4%
Pressure: 120 Torr
Synthesis time: 1 h
Film thickness: about 4 μm
Boron concentration: about $10^{18}$ cm$^{-3}$
Electrode Formation Conditions
<Schottky Electrode>
Oxygen termination of surface by hot mixed acid treatment (250° C., 50 min)
Pattern formation by EB lithography
Electrode: Mo (10 nm)/Au (30 ran), EB evaporation
Electrode diameter: 100 μm; electrodes with diameters of 30 to 400 μm were formed outside the coalescence boundary for Murphy plot analysis.
<Ohmic Electrode>
Ti (10 nm)/Mo (10 nm)/Au (30 nm), EB evaporation
Electrode diameter: 2 mm FIGS. 10 and 11 show device maps (pVSBD device maps) of the stack prepared above. An electrode with a diameter of 100 μm was disposed astride the coalescence boundary, and electrodes with different electrode diameters were disposed outside the coalescence boundary (positioned in a central region of each mosaic region). As shown in FIG. 11, the electrode size in the central region (non-boundary region) was set from 30 to 400 μm to allow the defect density to be evaluated through evaluation of a non-defective/defective product rate based on electrical characteristics (Murphy plot). In the devices, an edge termination technique such as field plate or JTE was not used.

Current-Voltage Characteristics of Schottky Barrier Diode

Figure 12:
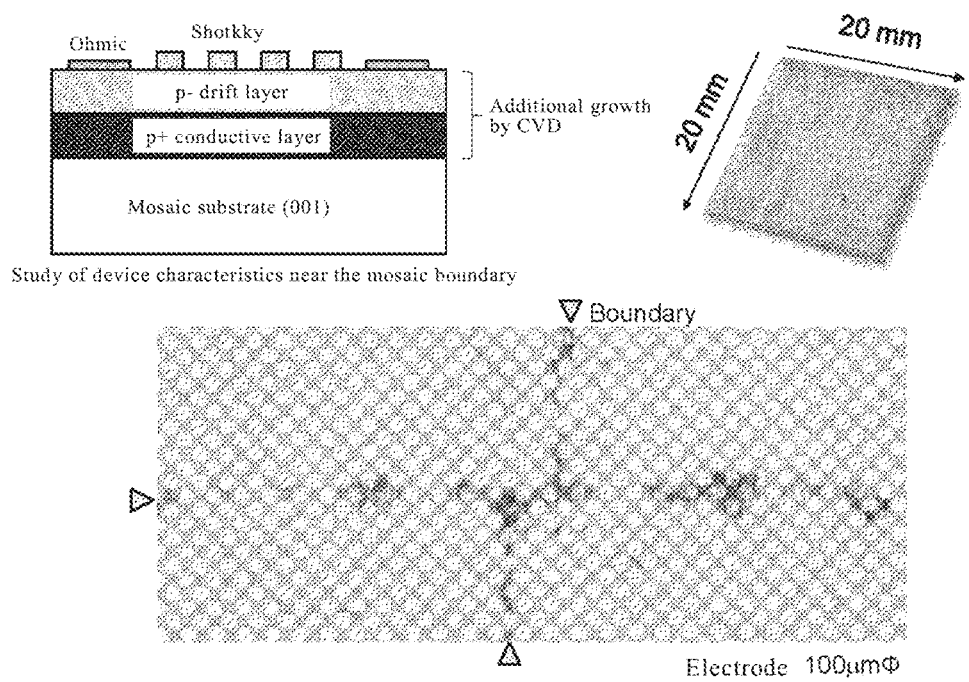
FIG. 12 is a diagram showing the device structure of a stack in which a p+ conductive layer and a p− drift layer are stacked on a single-crystal diamond substrate (stacked diamond for a pseudovertical Schottky barrier diode (pVSBD)) in the Examples.

The current-voltage characteristics of the stack (pseudovertical Schottky barrier diode) obtained above were evaluated. FIG. 12 shows a device structure of the stack (pseudovertical Schottky barrier diode) obtained above. In the device structure, Schottky electrodes with a diameter of 100 μm were arranged astride the coalescence boundary, so that the influence of the coalescence boundary on the device characteristics could be evaluated. Thus, the current-voltage (I-V) characteristics were measured in the air at room temperature, using a semiconductor parameter analyzer (Agilent Technologies B 1505A).

Figure 13:
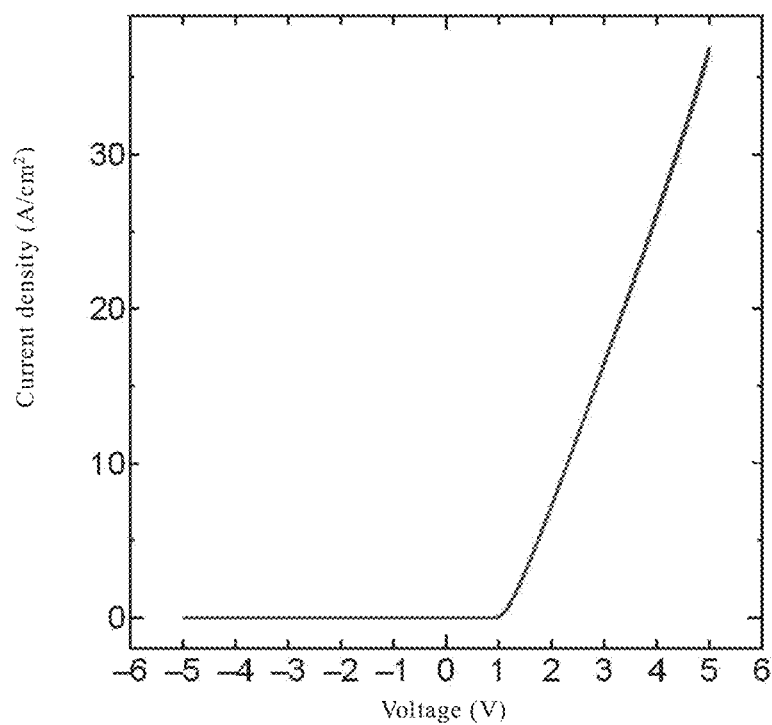
FIG. 13 is a graph showing the I-V characteristics of Schottky devices formed on the coalescence boundary in the Examples.

FIG. 13 shows the I-V characteristics of the Schottky devices formed on the coalescence boundary. The devices were confirmed to exhibit clear rectifying operation, regardless of the presence or absence of the boundary. In the forward direction, a steep rise was observed at about 1 V, and, in the reverse direction, a leakage current of not more than $10^{-11}$ A, which is the detection limit of the analyzer, was observed in a low-voltage region. The rectification ratio was at most $10^8$. It was revealed that the devices on the boundary exhibit a rectification ratio as high as that outside the boundary. It is known from previous reports that devices with a high density of defects have an ohmic-like huge leak path ("S. Ohmagari., T. Teraji, Y. Koide, Non-destructive detection of killer defects of diamond Schottky harrier diodes, J. Appl. Phys. 110 (2011) 5-8. doi:10.1063/1.3626791." and "H. Umezawa, N. Tokuda, M. Ogura, S. G. Ri, S. ichi Shikata, Characterization of leakage current on diamond Schottky barrier diodes using thermionic-field emission modeling, Diam. Relat. Mater. 15 (2006) 1949-1953. doi:10.1016/j.diamond.2006.08.030."; in contrast to the results, however, it was found that even on the coalescence boundary, device characteristics identical to those outside the coalescence boundary can be obtained. This is believed to be the effect of connecting substrates reproduced from an identical seed crystal (so-called copy substrates) (i.e., no gaps are present in the coalescence boundary, as in the method for producing a mosaic diamond adopted in, for example, the article in "Yamada et al., Diamond Relat. Mater. 24 (2012) 29", or Patent Literature 3, Japanese Patent No. 4849691, WO 2011/074599 A1, JP 2015-67516A, or JP 2015-67517 A), as shown in FIG. 4. More specifically, through the use of a single-crystal diamond substrate wherein the coalescence boundary of the single-crystal diamond substrate is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, and the coalescence boundary has a width of 200 μm or more, a continuous crystal structure is maintained even on the coalescence boundary, so that devices can be formed even on the coalescence boundary.

Study of Non-Defective Product Rate Using Murphy's Plot

Figure 14:
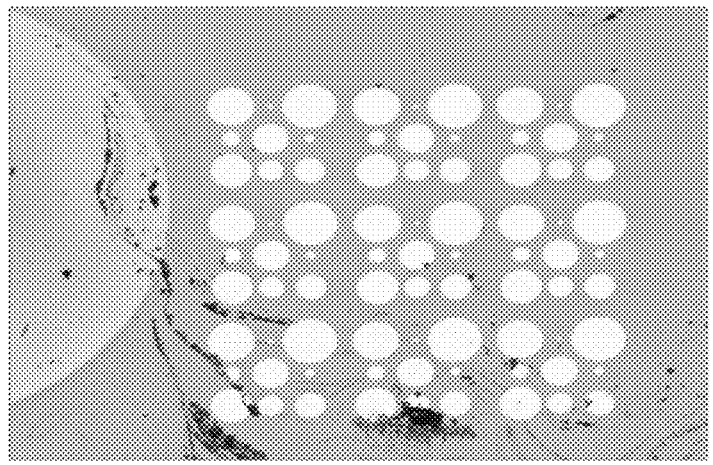
FIG. 14 is an optical microscope image of Schottky electrodes for Murphy's plot analysis in the Examples.
Figure 14:
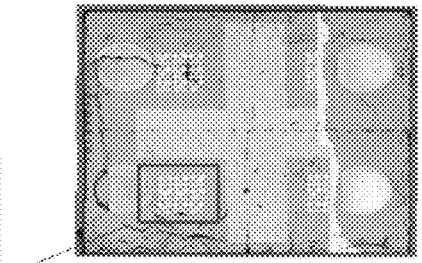
Figure 15:
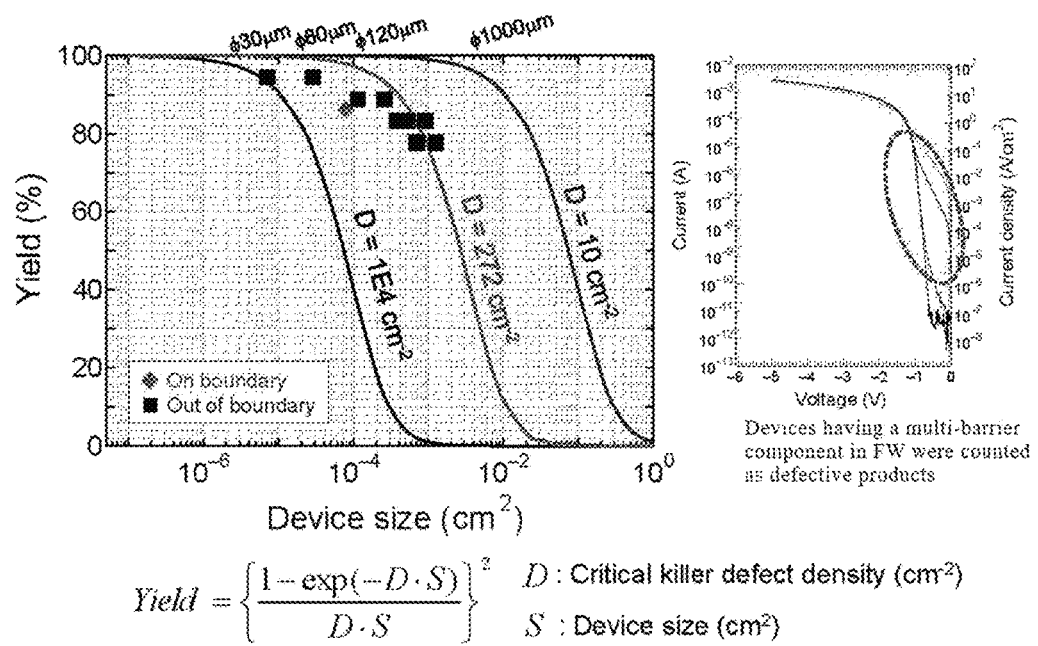
FIG. 15 is a Murphy's plot in the Examples.

On the single-crystal diamond substrate obtained above, devices having different areas of Schottky electrodes as shown in FIG. 14 were produced in a region sufficiently away from the coalescence boundary. A device in which a huge leakage current was generated, and having an ohmic-like conduction path (multi-barrier component) in the forward direction, was determined as a defective product. In the case of an electrode with a diameter of 30 μm outside the boundary, one out of a total of 18 measured devices was found to be defective (defective product rate: 6%); and in the case of an electrode with a diameter of 400 μm outside the boundary, four out of 18 devices were found to be defective (defective product rate: 23%). On the boundary (electrode diameter: 100 μm), four out of 29 devices were found to be defective (defective product rate: 14%). FIG. 15 shows a Murphy's plot (a device in which a huge leakage current was generated, and a multi-barrier component was observed in the forward-direction characteristics, was determined as a defective product). The yield (non-defective product rate) for each electrode size was fit to the following expression:

[Expression 2]

$$\text{Yield} = \left\{ \frac{1 - \exp(-D \cdot S)}{D \cdot S} \right\}^2 \quad (2)$$

where D is the critical defect density (cm$^{-2}$), and S is the device area (cm$^2$) The fitting result estimated that I)=272 cm$^{-2}$, While the result for an electrode size of 100 μm only was obtained on the boundary, the yield was found to be positioned on the same curve of the plot outside the boundary. The fact that devices can be produced at a similar non-defective rate, regardless of whether the devices are on or outside the coalescence boundary, is highly advantageous in terms of production.

Analysis of Ideality Factor and Barrier Height of Schottky Diode

Based on the I-V characteristics in the forward direction of the Schottky devices formed on the coalescence boundary, the ideality factor (n) and the barrier height ($\phi_B$) of the Schottky diodes can be determined based on the following expressions:

[Expression 3]

$$J = J_s \exp(-qV/nkT) \quad (3)$$

$$J_s = A^* T^2 \exp(-q\phi_B/kT) \quad (4)$$

where J is the current density (A/cm$^2$) in the forward direction q, k, and T are the elementary charge, the Boltzmann constant, and the temperature (K), respectively; and A* is the Richardson constant, which is 90 (A/K$^2$) for diamond.

Figure 16:
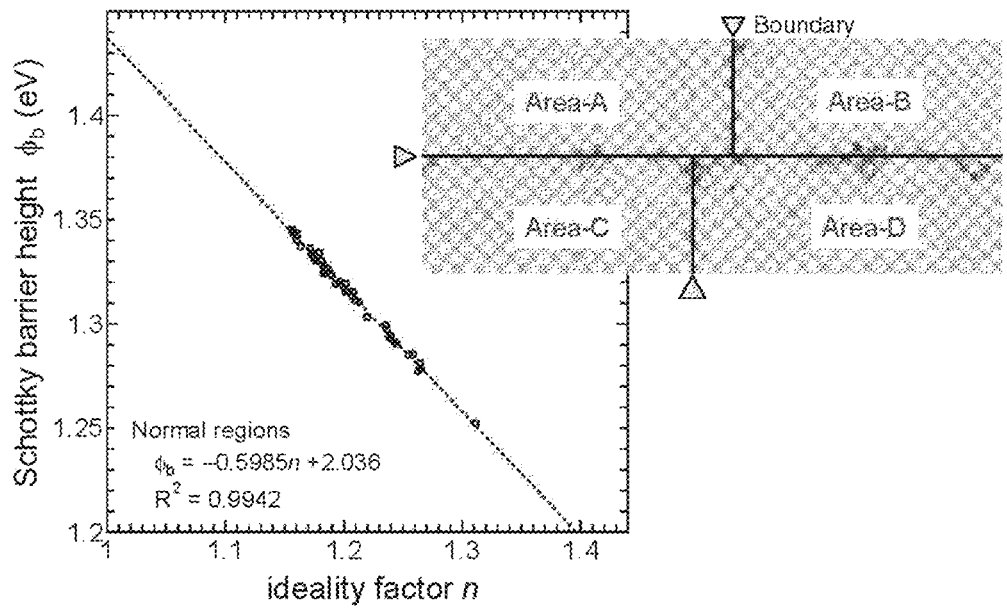
FIG. 16 is a graph showing analytical results excluding the electrode on the coalescence boundary in the Examples (a plot of the ideality factor (n) versus the barrier height ($\phi_B$) of Schottky barrier diodes outside the coalescence boundary; evaluation results for the regions Area-A to Area-D excluding the electrode on the coalescence boundary).

For each electrode, the n and $\phi_B$ values were determined. Table 1 shows the device characteristics of the Schottky barrier diodes formed outside the coalescence boundary. Table 2 shows the device characteristics of the Schottky barrier diodes formed on the coalescence boundary. FIG. 16 shows analytical results excluding the electrode on the coalescence boundary (a plot of the ideality factor (n) versus the barrier height ($\phi_B$) of Schottky barrier diodes outside the coalescence boundary; evaluation results for the regions Area-A to Area-D excluding the electrode on the coalescence boundary). The Schottky barrier diodes were sectioned into Area-A to Area-D as shown in the inset, along the boundaries formed using a crystal central region as the center. The evaluation results for all of these sections are shown as Normal regions on the same graph. Then value was estimated to be between 1.15 and 1.33. Values close to the ideality factor n=1 were obtained, indicating that the diffusion current was predominant. The $\phi_B$ value was distributed between 1.25 to 1.35 eV. The $\phi_B$ value at n=1 was 1.44 eV as estimated from the extrapolated straight line. Since the characteristics were distributed on a single straight line in the n-$\phi_B$ plot, variations in the characteristics due to differences in the seed crystal were not observed.

Figure 17:
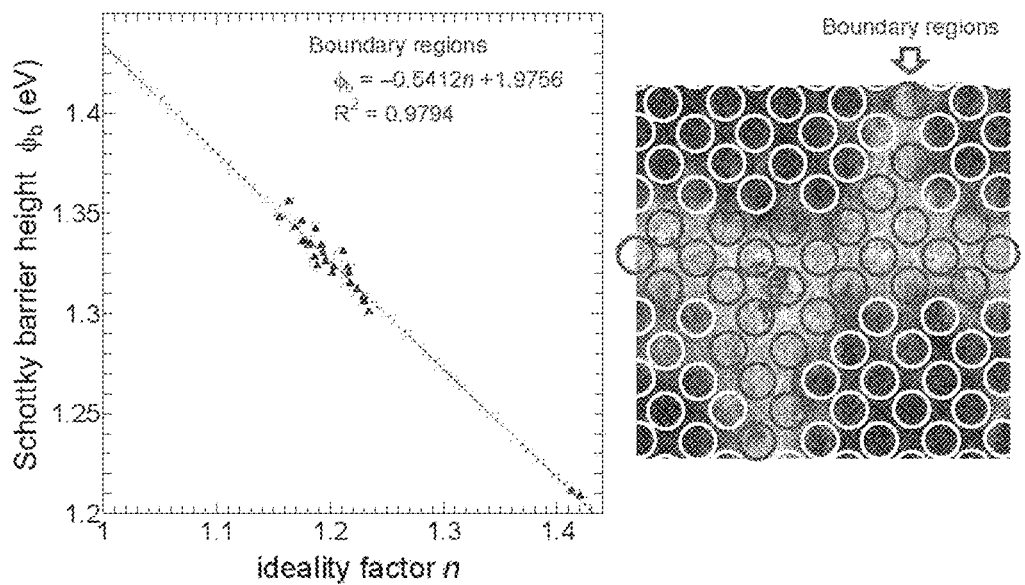
FIG. 17 is an n-$\phi_B$ plot on the coalescence boundary in the Examples (a plot of the ideality factor (n) versus the barrier height ($\phi_B$) of Schottky barrier diodes on the coalescence boundary; in the analysis, the black-circle electrode shown in a Raman mapping image (right) was defined as being on the boundary).

Subsequently, FIG. 17 is an n-$\phi_B$ plot on the coalescence boundary (a plot of the ideality factor (n) versus the barrier height ($\phi_B$) of Schottky barrier diodes on the coalescence boundary; in the analysis, the black-circle electrode shown in a Raman mapping image (right) was defined as being on the boundary). Since the Raman mapping result showed broadening of the FWHM value over about 400 μm near the boundary, the electrode region indicated by the black circles was sectioned as the characteristics on the boundary, as shown in the inset. On the boundary, n=1.15 to 1.42, and $\phi_B$=1.21 to 1.36 eV. The $\phi_B$ value at n=1 was 1.43 eV, which was the same as the value (1.44 eV) outside the boundary. It can be determined that the current conduction mechanisms on and outside the boundary are the same.

TABLE 1

| Device Number | Ideality Factor n | Schottky Barrier Height (eV) |
| --- | --- | --- |
| 1A | 1.20 | 1.32 |
| 2A | 1.26 | 1.28 |
| 3A | 1.18 | 1.33 |
| 4A | 1.17 | 1.34 |
| 5A | 1.31 | 1.25 |
| 6A | 1.18 | 1.33 |
| 7A | 1.21 | 1.31 |
| 8A | 1.18 | 1.33 |
| 9A | 1.27 | 1.28 |
| 10A | 1.16 | 1.34 |
| 11A | 1.24 | 1.29 |
| 12A | 1.27 | 1.28 |
| 13A | 1.21 | 1.31 |
| 14A | 1.26 | 1.28 |
| 15A | 1.25 | 1.29 |

TABLE 1-continued

| Device Number | Ideality Factor n | Schottky Barrier Height (eV) |
|---|---|---|
| 16A | 1.16 | 1.34 |
| 17A | 1.19 | 1.32 |
| 18A | 1.17 | 1.33 |
| 19A | 1.19 | 1.33 |
| 20A | 1.16 | 1.34 |
| 21A | 1.20 | 1.32 |
| 22A | 1.19 | 1.32 |
| 23A | 1.18 | 1.33 |
| 24A | 1.20 | 1.32 |
| 25A | 1.21 | 1.31 |
| 26A | 1.24 | 1.29 |
| 27A | 1.26 | 1.28 |
| 28A | 1.18 | 1.33 |
| 29A | 1.24 | 1.30 |
| 30A | 1.24 | 1.29 |
| 31A | 1.24 | 1.30 |
| 32A | 1.20 | 1.32 |
| 33A | 1.19 | 1.32 |
| 34A | 1.19 | 1.32 |
| 35A | 1.21 | 1.31 |
| 36A | 1.19 | 1.32 |
| 37A | 1.18 | 1.33 |
| 38A | 1.18 | 1.33 |
| 39A | 1.16 | 1.35 |
| 40A | 1.16 | 1.34 |
| 41A | 1.16 | 1.34 |
| 42A | 1.16 | 1.34 |
| 43A | 1.22 | 1.30 |
| 44A | 1.17 | 1.33 |
| 45A | 1.21 | 1.31 |
| 46A | 1.16 | 1.34 |
| 47A | 1.18 | 1.32 |
| 48A | 1.16 | 1.34 |
| 49A | 1.18 | 1.33 |
| 50A | 1.18 | 1.33 |
| 51A | 1.18 | 1.33 |

TABLE 2

| Device Number | Ideality Factor n | Schottky Barrier Height (eV) |
|---|---|---|
| 1B | 1.22 | 1.31 |
| 2B | 1.23 | 1.31 |
| 3B | 1.23 | 1.31 |
| 4B | 1.22 | 1.31 |
| 5B | 1.18 | 1.34 |
| 6B | 1.19 | 1.32 |
| 7B | 1.22 | 1.32 |
| 8B | 1.18 | 1.34 |
| 9B | 1.23 | 1.30 |
| 10B | 1.22 | 1.32 |
| 11B | 1.21 | 1.33 |
| 12B | 1.41 | 1.21 |
| 13B | 1.19 | 1.34 |
| 14B | 1.20 | 1.32 |
| 15B | 1.20 | 1.33 |
| 16B | 1.19 | 1.33 |
| 17B | 1.19 | 1.33 |
| 18B | 1.20 | 1.32 |
| 19B | 1.18 | 1.34 |
| 20B | 1.19 | 1.33 |
| 21B | 1.42 | 1.21 |
| 22B | 1.18 | 1.33 |
| 23B | 1.16 | 1.36 |
| 24B | 1.17 | 1.34 |
| 25B | 1.18 | 1.35 |
| 26B | 1.16 | 1.35 |

The invention claimed is:

1. A power semiconductor device comprising a stack comprising:
   (a) a single-crystal diamond layer comprising a plurality of single-crystal diamond substrates having a coalescence boundary between the single-crystal diamond substrates, and
   (b) at least a semiconductor drift layer stacked on the single-crystal diamond layer, wherein
   the coalescence boundary of the plurality of single-crystal diamond substrates is a region that exhibits, in a Raman spectrum at a laser excitation wavelength of 785 nm, a full width at half maximum of a peak near 1332 cm$^{-1}$, wherein the full width is equivalent to a maximum width of a peak exhibited by a region outside of the coalescence boundary,
   the coalescence boundary has a width of 200 μm or more, and
   the semiconductor drift layer is stacked on at least the coalescence boundary.

2. A method for producing a power semiconductor device according to claim 1, comprising the steps of:
   preparing the plurality of single-crystal diamond substrates having a coalescence boundary; and
   stacking a semiconductor drift layer on at least the coalescence boundary of the plurality of single-crystal diamond substrates, wherein
   the coalescence boundary of the plurality of single-crystal diamond substrates is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, and
   the coalescence boundary has a width of 200 μm or more.

3. The power semiconductor device according to claim 1, wherein a P+ conductive layer and the semiconductor drift layer are stacked in this order on the coalescence boundary.

4. A method for producing a power semiconductor device according to claim 3, comprising the steps of:
   preparing a stack A comprising a P+ conductive layer stacked on at least a coalescence boundary of the plurality of single-crystal diamond substrates having the coalescence boundary; and
   further stacking a semiconductor drift layer on the P+ conductive layer, wherein
   the coalescence boundary of the plurality of single-crystal diamond substrates is a region that exhibits, in a Raman spectrum at a laser excitation wavelength of 785 nm, a full width at half maximum of a peak near 1332 cm$^{-1}$ due to diamond that is observed to be broader than a full width at half maximum of the peak exhibited by a region different from the coalescence boundary, and
   the coalescence boundary has a width of 200 μm or more.

5. A method for producing a power semiconductor device according to claim 3, comprising the steps of:
   preparing a stack B comprising a P+ conductive layer and a semiconductor drift layer stacked in this order on a coalescence boundary of the plurality of single-crystal diamond substrates having the coalescence boundary; and
   further stacking an electrode on the semiconductor drift layer, wherein
   the coalescence boundary of the plurality of single-crystal diamond substrates is a region that exhibits, in a Raman spectrum at a laser excitation wavelength of 785 nm, a full width at half maximum of a peak near 1332 cm$^{-1}$, wherein a full width is equivalent to a maximum width of a peak exhibited by a region outside of the coalescence boundary, and
   the coalescence boundary has a width of 200 μm or more.

6. The power semiconductor device according to claim 3, wherein an electrode is further stacked on the semiconductor drift layer.

\* \* \* \* \*